US012642028B2

(12) United States Patent
Dahal et al.

(10) Patent No.:  US 12,642,028 B2
(45) Date of Patent:      May 26, 2026

(54) METHODS FOR WET ATOMIC LAYER ETCHING OF TUNGSTEN

(71) Applicant: Tokyo Electron Limited, Tokyo (JP)

(72) Inventors: Tulashi Dahal, Austin, TX (US); Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 18/619,491

(22) Filed: Mar. 28, 2024

(65) Prior Publication Data

US 2025/0308917 A1      Oct. 2, 2025

(51) Int. Cl.
| | |
|---|---|
| *H10P 50/28* | (2026.01) |
| *H10P 14/60* | (2026.01) |
| *H10P 72/00* | (2026.01) |

(52) U.S. Cl.
CPC ........ *H10P 50/283* (2026.01); *H10P 14/6534* (2026.01); *H10P 72/0424* (2026.01); *H10P 72/0604* (2026.01)

(58) Field of Classification Search
None
See application file for complete search history.

(56) References Cited

U.S. PATENT DOCUMENTS

| | | |
|---|---|---|
| 8,961,814 B2 | 2/2015 | Van Duren et al. |
| 9,365,770 B2 | 6/2016 | Okabe et al. |
| 9,768,327 B2 | 9/2017 | Woehl et al. |
| 10,096,487 B2 | 10/2018 | Yang et al. |
| 10,982,335 B2 | 4/2021 | Abel |

| | | |
|---|---|---|
| 2017/0053810 A1 | 2/2017 | Yang et al. |
| 2019/0198392 A1 | 6/2019 | Mullick et al. |
| 2020/0161148 A1* | 5/2020 | Abel .................. H10P 72/0422 |
| 2020/0286743 A1 | 9/2020 | Lai et al. |
| 2022/0148885 A1 | 5/2022 | Abel et al. |
| 2022/0392752 A1 | 12/2022 | Lin et al. |

(Continued)

FOREIGN PATENT DOCUMENTS

| | | |
|---|---|---|
| KR | 20210151229 | 12/2021 |
| WO | 2017099718 | 6/2017 |

OTHER PUBLICATIONS

Dahal et al., "Methods for Wet Atomic Layer Etching of Molybdenum in Aqueous Solution", U.S. Appl. No. 18/636,818, filed Apr. 16, 2024, 62 pgs.

(Continued)

*Primary Examiner* — Roberts P Culbert

(74) *Attorney, Agent, or Firm* — Egan, Enders & Huston LLP.

(57) ABSTRACT

Various embodiments of methods are provided for etching tungsten in a wet ALE process. The methods disclosed herein use a wide variety of techniques and wet etch chemistries to: (a) oxidize a tungsten surface and form a self-limiting, tungsten oxide passivation layer in a surface modification step of the wet ALE process, and (b) selectively remove the tungsten oxide passivation layer in a dissolution step of the wet ALE process. In the embodiments disclosed herein, ligand-assisted dissolution is used to selectively remove the tungsten oxide passivation layer without removing the unmodified tungsten surface underlying the tungsten oxide passivation layer. The ligand added to the dissolution solution prevents the dissolution solution from attacking and removing the unmodified tungsten surface.

24 Claims, 16 Drawing Sheets

(56) References Cited

U.S. PATENT DOCUMENTS

| | | |
|---|---|---|
| 2023/0117790 A1 | 4/2023 | Abel |
| 2023/0118554 A1 | 4/2023 | Abel |
| 2023/0121246 A1 | 4/2023 | Abel |
| 2023/0140900 A1 | 5/2023 | Netzband et al. |

OTHER PUBLICATIONS

Notification of Transmittal of the International Search Report and the Written Opinion of the International Searching Authority or the Declaration, International Application No. PCT/US2025/013710; International Filing Date Jan. 30, 2025, May 16, 2025, 10 pgs.

Natarajan et al., "Mechanism of Thermal Atomic Layer Etch of W Metal Using Sequential Oxidation and Chlorination: A First-Principles Study", Applied Materials & Interfaces, ACS Appl. Mater. Interfaces, 2020, 11 pgs.

Fang et al., "Thermal Atomic Layer Etching: Mechanism, Materials and Prospects", ScienceDirect, National Laboratory of Solid State Microstructures, 2018, 9 pgs.

Xie et al., "Thermal Atomic Layer Etching of Metallic Tungsten via Oxidation and Etch Reaction Mechanism Using O2 or O3 for Oxidation and WCl6 as the Chlorinating Etchant", Journal of Vacuum Science Technology A, Obtained from Internet Feb. 2024, 40 pgs.

Xie et al., "Thermally Driven Self-Limiting Atomic Layer Etching of Metallic Tungsten Using WF6 and O2", Applied Materials & Interfaces, ACS Appl. Mater. Interfaces, 2018, 8 pgs.

Johnson et al., "WO3 and W Thermal Atomic Layer Etching Using "Conversion-Fluorination" and "Oxidation-Conversion-Flurorination" Mechanisms", Applied Materials & Interfaces, American Chemical Society, 2017, 13 pgs.

You et al., "Atomic Layer Etching of Tungsten DIsulfide Using Remote Plasma-Induced Oxidation and Wet Etching", The Electrochemical Society J Solid State Sci. Technology, 2023, 7 pgs.

Dahal et al., Methods for Wet Atomic Layer Etching of Molybdenum, U.S. Appl. No. 18/240,142, filed Aug. 30, 2023, 72 pgs.

* cited by examiner

Figure 1:
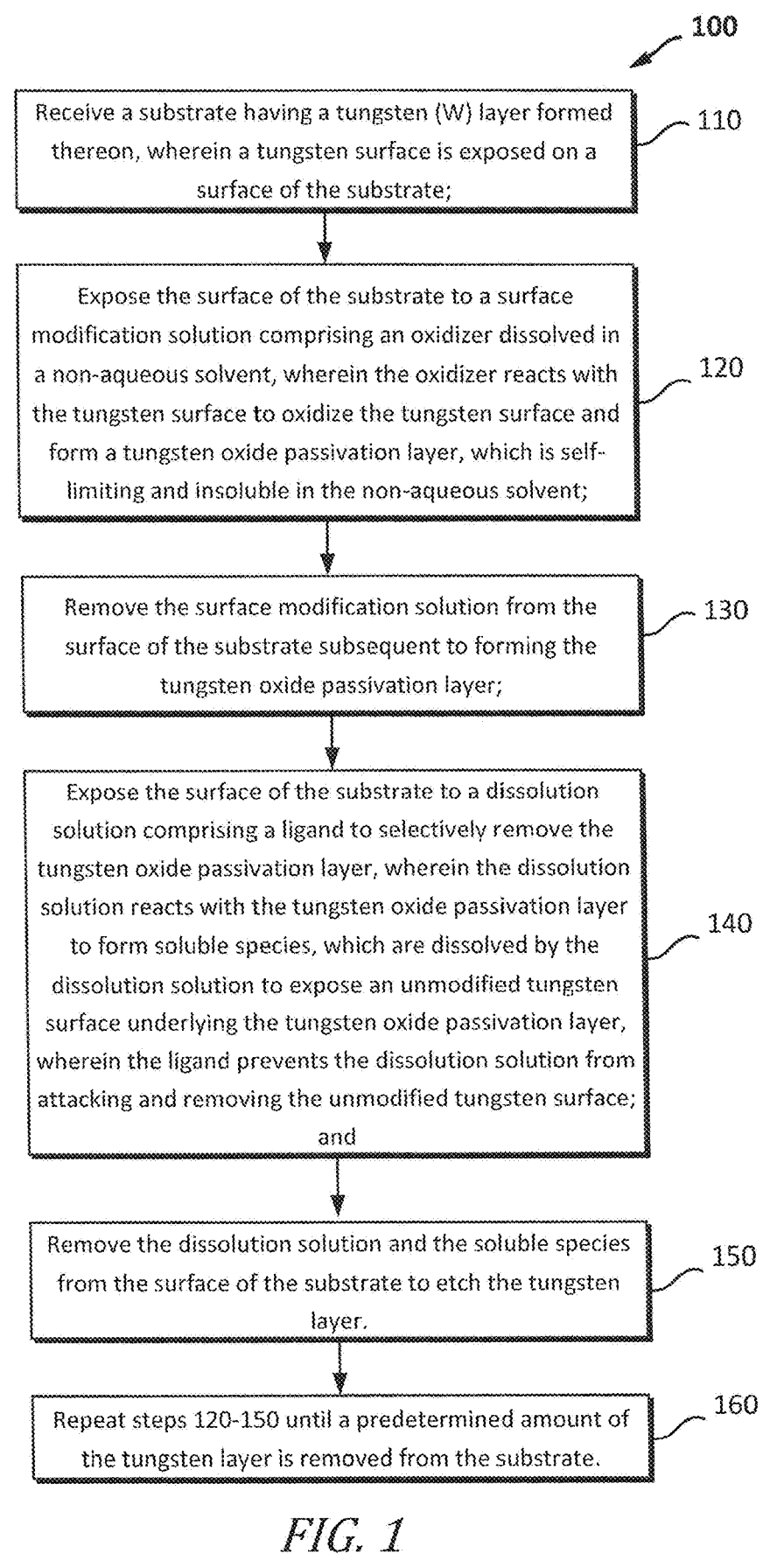

100

Receive a substrate having a tungsten (W) layer formed thereon, wherein a tungsten surface is exposed on a surface of the substrate; — 110

Expose the surface of the substrate to a surface modification solution comprising an oxidizer dissolved in a non-aqueous solvent, wherein the oxidizer reacts with the tungsten surface to oxidize the tungsten surface and form a tungsten oxide passivation layer, which is self-limiting and insoluble in the non-aqueous solvent; — 120

Remove the surface modification solution from the surface of the substrate subsequent to forming the tungsten oxide passivation layer; — 130

Expose the surface of the substrate to a dissolution solution comprising a ligand to selectively remove the tungsten oxide passivation layer, wherein the dissolution solution reacts with the tungsten oxide passivation layer to form soluble species, which are dissolved by the dissolution solution to expose an unmodified tungsten surface underlying the tungsten oxide passivation layer, wherein the ligand prevents the dissolution solution from attacking and removing the unmodified tungsten surface; and — 140

Remove the dissolution solution and the soluble species from the surface of the substrate to etch the tungsten layer. — 150

Repeat steps 120-150 until a predetermined amount of the tungsten layer is removed from the substrate. — 160

Figure 12:
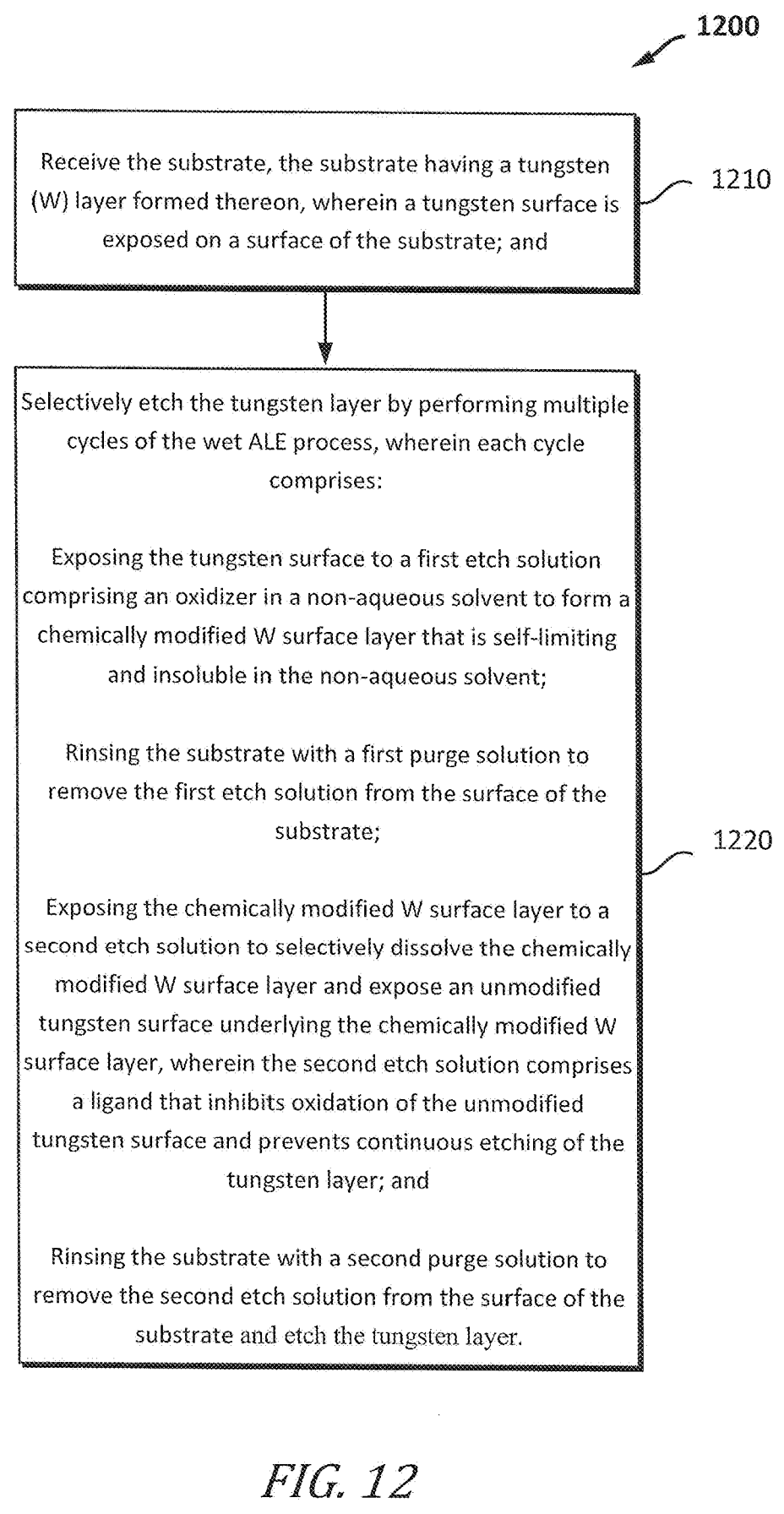

Receive the substrate, the substrate having a tungsten (W) layer formed thereon, wherein a tungsten surface is exposed on a surface of the substrate; and ⟶ 1210

Selectively etch the tungsten layer by performing multiple cycles of the wet ALE process, wherein each cycle comprises:

Exposing the tungsten surface to a first etch solution comprising an oxidizer in a non-aqueous solvent to form a chemically modified W surface layer that is self-limiting and insoluble in the non-aqueous solvent;

Rinsing the substrate with a first purge solution to remove the first etch solution from the surface of the substrate;

Exposing the chemically modified W surface layer to a second etch solution to selectively dissolve the chemically modified W surface layer and expose an unmodified tungsten surface underlying the chemically modified W surface layer, wherein the second etch solution comprises a ligand that inhibits oxidation of the unmodified tungsten surface and prevents continuous etching of the tungsten layer; and Rinsing the substrate with a second purge solution to remove the second etch solution from the surface of the substrate and etch the tungsten layer.

METHODS FOR WET ATOMIC LAYER ETCHING OF TUNGSTEN

RELATED APPLICATION

This application is related to co-pending U.S. patent application Ser. No. 18/240,142, entitled "Methods for Wet Atomic Layer Etching of Molybdenum," filed Aug. 30, 2023; the entirety of which is incorporated herein by reference.

BACKGROUND

This disclosure relates to semiconductor device manufacturing, and, in particular, to the removal and etching of polycrystalline materials, such as transition metals.

During routine semiconductor fabrication, various metals formed on a substrate may be removed by patterned etching, chemical-mechanical polishing, as well as other techniques. A variety of techniques are known for etching layers on a substrate, including plasma-based etching (otherwise referred to as dry etching) and liquid-based etching (otherwise referred to as wet etching). Wet etching generally involves dispensing a chemical solution over the surface of a substrate or immersing the substrate in the chemical solution. The chemical solution often contains a solvent, chemicals designed to react with materials on the substrate surface and chemicals to promote dissolution of the reaction products. As a result of exposure of the substrate surface to the etchant, material is removed from the substrate. Etchant composition and temperature may be controlled to control the etch rate, specificity and residual material on the surface of the substrate post-etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless of crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one monolayer (or a few monolayers) of material at a time. ALE processes generally rely on a chemical modification of the surface to be etched followed by a selective removal of the modified layer. Thus, ALE processes offer improved performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Tungsten (W) is widely used in integrated circuits as metal interconnects and diffusion barriers. Recently, controlled etch-back of tungsten has gained a growing interest for future device fabrications. Such applications require precise etch back of tungsten with improved, or at least preserved, post-etch surface morphology in the etched wafers. However, the polycrystalline nature of tungsten makes it susceptible to pitting if an etchant reacts at the grain boundaries with faster kinetics than the grain surface. Etchant chemistry should, at a minimum, leave the surface no rougher than it was initially, and ideally, improve the surface roughness during etching.

The post-etch surface roughness generally evolves with etch amount for many etchants traditionally used for etching tungsten. This leads to non-uniform material removal off the metal surface and results a rougher post-etch morphology. Accordingly, new wet etch chemistries are needed for etching tungsten.

SUMMARY

The present disclosure provides improved wet etch processes and methods for etching polycrystalline materials. More specifically, the present disclosure provides various embodiments of wet etch processes and methods that utilize new etch chemistries for etching transition metals, such as tungsten (W), in a wet etch process.

As described in more detail below, the embodiments disclosed herein expose a transition metal surface to a first etch solution to chemically modify the transition metal surface and form a modified surface layer (otherwise referred to herein as a passivation layer), which is selectively dissolved in a second etch solution to etch the transition metal surface. The first etch solution may include an oxidizer (or oxidizing agent) dissolved in a non-aqueous solvent. The oxidizer included within the first etch solution reacts with the transition metal surface to oxidize the transition metal surface and form a transition metal oxide passivation layer, which is self-limiting and insoluble in the non-aqueous solvent.

A wide variety of oxidation techniques and etch chemistries can be used for oxidizing an exposed transition metal surface (such as, e.g., tungsten, W) and forming a self-limiting transition metal oxide passivation layer on the underlying transition metal (e.g., metallic W). For example, the embodiments disclosed herein may use: (a) a peroxide oxidizer (such as, e.g., hydrogen peroxide, $H_2O_2$), or (b) an oxidizer having relatively large reactant molecule (such as, e.g., ammonium persulfate, APS) to oxidize the exposed transition metal surface and form a self-limiting transition metal oxide passivation layer. In some embodiments, various oxidation techniques may be used herein to control the oxidation behavior. For example, the embodiments disclosed herein may use: (a) ultra-violet (UV) photolysis of peroxide oxidizers to create oxidizing radicals, which limit oxidation of the tungsten surface and provide quasi-self-limiting oxidation behavior, or (b) ligand-assisted oxidation to change the surface chemistry of the tungsten oxide passivation layer and ensure self-limiting oxidation behavior. Depending on the oxidation technique and chemistry used, the tungsten surface may be oxidized to form a tungsten oxide (e.g., tungsten trioxide, $WO_3$), tungsten chloride (e.g., $WCl_x$) or tungsten oxychloride (e.g., $WO_yCl_{(x-2y)}$) passivation layer.

After forming a transition metal oxide passivation layer using one or more of the oxidation techniques disclosed herein, a second etch solution may be dispensed onto the surface of the substrate to selectively dissolve the transition metal oxide passivation layer, thus removing the transition metal oxide passivation layer from the substrate surface without etching the underlying transition metal (e.g., metallic W). Several etch chemistries can be used to selectively dissolve a tungsten oxide passivation layer without dissolving metallic W or substantially increasing the post-etch surface roughness of the tungsten surface. For example, the second etch solution may be an aqueous solution containing a ligand and either a base or an acid. As described in more detail below, the base (or acid) removes the tungsten oxide passivation layer to expose the metallic W underlying the tungsten oxide passivation layer. The ligand included within the second etch solution prevents the base (or acid) from removing the unmodified tungsten surface (e.g., metallic W) underlying the tungsten oxide passivation layer by inhibiting oxidation of the unmodified tungsten surface.

The embodiments disclosed herein preserve the post-etch surface roughness of the tungsten layer by limiting the concentration of the oxidizer used in the first etch solution and the concentration of the base (or acid) used in the second etch solution. In some embodiments, the oxidation temperature may be elevated to increase an etch rate of the tungsten layer when low oxidizer concentrations are used. The ligand added to the second etch solution is preferably a reducing agent that prevents continuous parasitic etch of the unmodified tungsten surface. Thus, including the ligand within the second etch solution is another technique that may be used to avoid increasing the post-etch surface roughness of the tungsten layer.

According to one embodiment, a method is provided herein for etching a substrate having a tungsten layer formed thereon. In some embodiments, the method may begin by receiving a substrate having a tungsten (W) layer formed thereon, where a tungsten surface is exposed on a surface of the substrate, and exposing the surface of the substrate to a surface modification solution comprising an oxidizer dissolved in a non-aqueous solvent. The oxidizer reacts with the tungsten surface to oxidize the tungsten surface and form a tungsten oxide passivation layer, which is self-limiting and insoluble in the non-aqueous solvent. The method further includes removing the surface modification solution from the surface of the substrate subsequent to forming the tungsten oxide passivation layer, and exposing the surface of the substrate to a dissolution solution comprising a ligand to selectively remove the tungsten oxide passivation layer. The dissolution solution reacts with the tungsten oxide passivation layer to form soluble species, which are dissolved by the dissolution solution to expose an unmodified tungsten surface underlying the tungsten oxide passivation layer. The ligand prevents the dissolution solution from attacking and removing the unmodified tungsten surface. The method further includes removing the dissolution solution and the soluble species from the surface of the substrate to etch the tungsten layer. In some embodiments, the steps of exposing the surface of the substrate to the surface modification solution, removing the surface modification solution, exposing the surface of the substrate to the dissolution solution, and removing the dissolution solution and the soluble species may be repeated a number of times until a predetermined amount of the tungsten layer is removed from the substrate.

A wide variety of chemical species may be added to the dissolution solution to prevent the dissolution solution from attacking and removing the unmodified tungsten surface during the dissolution step. In some embodiments, for example, a ligand may be added to the dissolution solution to inhibit oxidation of the unmodified tungsten surface. In other embodiments, a reducing agent may be used for the same purpose. Both of these methods prevent continuous etching of the tungsten layer during the dissolution step and enables the method disclosed herein to provide a post-etch surface roughness of the tungsten layer that is substantially equal to an initial surface roughness of the tungsten layer before etching.

In some embodiments, the ligand added to the dissolution solution may contain an ascorbate anion. For example, the ligand may be ascorbic acid, sodium ascorbate, calcium ascorbate or potassium ascorbate. However, other ligands or reducing agents can also be used to prevent continuous etching of the tungsten layer during the dissolution step. For example, carboxylic acids (such as, e.g., oxalic acid, formic acid, acetic acid, etc.), amine-containing ligands (such as, e.g., ethylenediamine, ethylenediaminetetraacetic acid (EDTA), iminodiacetic acid, etc.), or other molecules that bind to the metal surface through N, P, O, or S heteroatoms can be used as a reducing agent or ligand. Although several different types of reducing agents may be used, ligands containing ascorbate anions (such as, e.g., ascorbic acid) may enable higher etch rates than ligands containing other anions (such as, e.g., formate anions, oxalate anions, etc.), and thus, may be preferred in some embodiments.

In addition to the ligand, the dissolution solution may contain a base or an acid. In some embodiments, the dissolution solution may be an aqueous basic solution comprising: (i) the ligand, and (ii) ammonium hydroxide ($NH_4OH$), tetramethylammonium hydroxide (TMAH), potassium hydroxide (KOH) or calcium hydroxide (Ca(OH)$_2$). In other embodiments, the dissolution solution may be an aqueous acidic solution comprising: (i) the ligand, and (ii) hydrochloric acid (HCl), nitric acid or sulfuric acid.

A wide variety of oxidizers and non-aqueous solvents may be used in the surface modification solution to oxidize the tungsten surface and form a tungsten oxide passivation layer. In some embodiments, the oxidizer included within the surface modification solution may react with the tungsten surface to oxidize the tungsten surface and form a tungsten trioxide (WO$_3$) passivation layer, which is self-limiting and insoluble in the non-aqueous solvent. For example, ammonium persulfate (APS) dissolved in methanol (CH$_3$OH) or hydrogen peroxide (H$_2$O$_2$) dissolved in isopropyl alcohol (IPA) may be used to oxidize the tungsten surface and form a self-limiting tungsten trioxide (WO$_3$) passivation layer, in some embodiments.

In some embodiments, the concentration of the oxidizer used in the surface modification solution may be selected to avoid substantially increasing the post-etch surface roughness of the tungsten layer compared to the initial surface roughness of the tungsten layer before etching. When ammonium persulfate (APS) is used, a concentration of the ammonium persulfate in the surface modification solution may range between 0.005% and 0.1% to preserve the post-etch surface roughness of the tungsten layer. When hydrogen peroxide (H$_2$O$_2$) is used, a concentration of the hydrogen peroxide in the surface modification solution may range between 0.05% and 1% to preserve the post-etch surface roughness of the tungsten layer.

In some embodiments, the oxidation temperature may be elevated above room temperature to increase an etch rate of the tungsten layer when low oxidizer concentrations are used in the surface modification solution. While the oxidation step can be performed over a wide range of oxidation temperatures, the maximum oxidation temperature is limited to the lower value between the boiling point of the solvent (e.g., methanol or IPA) or the decomposition temperature of the oxidizer (e.g., APS or H$_2$O$_2$). For a surface modification solution comprising APS in methanol, the maximum oxidation temperature is the boiling point of methanol at 65° C. Thus, when APS in methanol is used, the surface of the substrate may be exposed to the surface modification solution at a temperature ranging between 25° C. and 65° C. to increase the etch rate of the tungsten layer. However, other oxidation temperatures may be appropriate when using other surface modification solutions.

In one preferred embodiment, an aqueous basic solution comprising a ligand and a base may be used in the dissolution solution to selectively remove a tungsten trioxide (WO$_3$) passivation layer. The base removes the tungsten trioxide (WO$_3$) passivation layer to expose the unmodified tungsten surface underlying the passivation layer. The ligand prevents the base from removing the unmodified tungsten surface and increasing the post-etch surface roughness of the tungsten layer compared to the initial surface roughness of the tungsten layer before etching. The amount of ligand needed to prevent parasitic etch of the tungsten surface depends on the concentration of the base included within the dissolution solution. In some embodiments, the dissolution solution may be an aqueous basic solution comprising 0 mM to 10 mM ascorbic acid dissolved in 0.05 mM to 1M of ammonium hydroxide (NH$_4$OH) and water. In one example implementation, 10 mM of ascorbic acid dissolved in 2-100 mM of NH$_4$OH results in self-limiting dissolution; however, other concentrations of ascorbic acid and NH$_4$OH may also be used.

According to another embodiment, a method is provided herein for etching a substrate using a wet atomic layer etching (ALE) process. In some embodiments, the method may begin by receiving the substrate, the substrate having a tungsten (W) layer formed thereon, wherein a tungsten surface is exposed on a surface of the substrate. The method further includes selectively etching the tungsten layer by performing multiple cycles of the wet ALE process, wherein each cycle comprises: (a) exposing the tungsten surface to a first etch solution comprising an oxidizer in a non-aqueous solvent to form a chemically modified W surface layer that is self-limiting and insoluble in the non-aqueous solvent; (b) rinsing the substrate with a first purge solution to remove the first etch solution from the surface of the substrate; (c) exposing the chemically modified W surface layer to a second etch solution to selectively dissolve the chemically modified W surface layer expose an unmodified tungsten surface underlying the chemically modified W surface layer; and (d) rinsing the substrate with a second purge solution to remove the second etch solution from the surface of the substrate and etch the tungsten layer. In this embodiment, the second etch solution comprises a ligand that inhibits oxidation of the unmodified tungsten surface and prevents continuous etching of the tungsten layer during the dissolution step (step c).

A wide variety of oxidizers and non-aqueous solvents may be used in the first etch solution to form the chemically modified W surface layer. In some embodiments, the oxidizer included within the first etch solution may react with the tungsten surface to oxidize the tungsten surface and form a tungsten trioxide (WO$_3$) passivation layer, which is self-limiting and insoluble in the non-aqueous solvent. For example, ammonium persulfate (APS) dissolved in methanol (CH$_3$OH) or hydrogen peroxide (H$_2$O$_2$) dissolved in isopropyl alcohol (IPA) may be used to oxidize the tungsten surface and form a self-limiting tungsten trioxide (WO$_3$) passivation layer, in some embodiments.

In some embodiments, the concentration of the oxidizer used in the first etch solution may be selected to avoid substantially increasing the post-etch surface roughness of the tungsten layer compared to the initial surface roughness of the tungsten layer before etching. When ammonium persulfate (APS) is used, a concentration of the ammonium persulfate in the first etch solution may range between 0.005% and 0.1% to preserve the post-etch surface roughness of the tungsten layer. When hydrogen peroxide (H$_2$O$_2$) is used, a concentration of the hydrogen peroxide in the surface modification solution may range between 0.05% and 1% to preserve the post-etch surface roughness of the tungsten layer.

In some embodiments, the oxidation temperature may be elevated above room temperature to increase an etch rate of the tungsten layer when low oxidizer concentrations are used in the first etch solution. In one example, the surface of the substrate may be exposed to the first etch solution at a temperature ranging between 25° C. and 65° C. to increase the etch rate of the tungsten layer when the first etch solution includes APS in methanol.

In some embodiments, an aqueous basic solution comprising a ligand and a base may be used in the second etch solution to selectively dissolve the chemically modified W surface layer (such as, e.g., a tungsten trioxide (WO$_3$) passivation layer). The base removes the chemically modified W surface layer to expose the unmodified tungsten surface underlying the chemically modified W surface layer. The ligand prevents the base from removing the unmodified tungsten surface and increasing a post-etch surface roughness of the tungsten layer compared to an initial surface roughness of the tungsten layer before etching.

A wide variety of ligands and bases may be used in the second etch solution to selectively dissolve the chemically modified W surface layer without increasing the post-etch surface roughness of the tungsten layer. For example, the base may be ammonium hydroxide ($NH_4OH$), tetramethyl-ammonium hydroxide (TMAH), potassium hydroxide (KOH) or calcium hydroxide ($Ca(OH)_2$). Examples of ligands that may be added to the base include, but are not limited to, ascorbic acid, sodium ascorbate, calcium ascorbate, potassium ascorbate, oxalic acid, formic acid, acetic acid, ethylenediamine, ethylenediaminetetraacetic acid (EDTA), and iminodiacetic acid. In one example implementation, the dissolution solution may be an aqueous basic solution comprising 0 mM to 10 mM ascorbic acid dissolved in 0.05 mM to 1M of ammonium hydroxide ($NH_4OH$) and water.

As noted above and described further herein, the present disclosure provides various embodiments of methods that utilize new etch chemistries for etching a transition metal layer in a wet etch process. Specifically, methods and new etch chemistries are provided herein for etching tungsten (W) in a wet ALE process. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary Section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1 is a flowchart diagram illustrating one embodiment of a method that utilizes the techniques disclosed herein for etching a substrate having a tungsten surface exposed on a surface of the substrate.

FIG. 2 illustrates one example of a cyclic wet ALE process that can be used to etch a transition metal surface, such as a tungsten surface, in accordance with a first embodiment of the present disclosure.

FIG. 12 is a flowchart diagram illustrating one embodiment of a method that utilizes the techniques disclosed herein for etching a substrate having a tungsten surface exposed on a surface of the substrate using a cyclic wet atomic layer etching (ALE) process.

DETAILED DESCRIPTION

Figure 3:
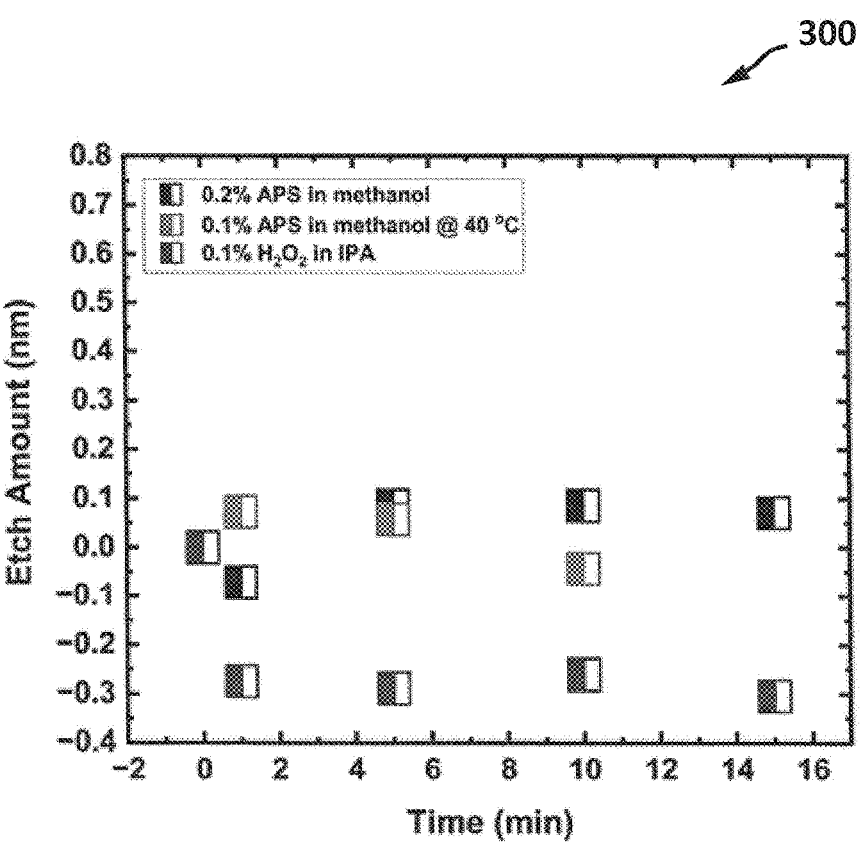
FIG. 3 is a graph depicting exemplary etch amounts (expressed in nanometers, nm) that may be achieved over time (expressed in minutes, min) when etching a tungsten surface using various surface modification solutions in the wet ALE process shown in FIG. 2.

Wet atomic layer etching (ALE) processes can be used to etch transition metals formed on a substrate by performing one or more cycles of the wet ALE process, where each cycle includes a surface modification step and a dissolution step. In the surface modification step, an exposed surface of the transition metal may be exposed to a surface modification solution containing an oxidizer to chemically modify the exposed surface of the transition metal and form a modified surface layer (e.g., a transition metal oxide passivation layer). In the dissolution step, the modified surface layer may be selectively removed by exposing the modified surface layer to a dissolution solution to dissolve the modified surface layer. Purge steps may be performed between the surface modification and dissolution steps to prevent the surface modification and dissolution solutions from mixing, and the process may be repeated in a cyclic manner until a desired amount of etching is achieved. In order to achieve atomic layer etching, however, at least one of the surface modification and dissolutions steps must be self-limiting.

A variety of transition metals may be etched using wet ALE processes, including cobalt (Co), ruthenium (Ru), copper (Cu), gold (Au), platinum (Pt), Iridium (Ir), molybdenum (Mo), etc. Wet ALE processes for etching such transition metals are disclosed in U.S. Pat. No. 10,982,335, entitled "Wet Atomic Layer Etching Using Self-Limiting and Solubility-limited Reactions," U.S. Pat. No. 11,802,342, entitled "Methods for Wet Atomic Layer Etching of Ruthenium," U.S. Pat. No. 11,866,831, entitled "Methods for Wet Atomic Layer Etching of Copper," US Patent Application Publication No. 2023/0121246, entitled "Methods for Wet Atomic Layer Etching of Noble Metals," and U.S. patent application Ser. No. 18/240,142, entitled "Methods for Wet Atomic Layer Etching of Molybdenum," each of which is incorporated herein by reference.

Tungsten (W) is another transition metal used in semiconductor manufacturing. However, developing wet ALE chemistries for etching tungsten is difficult because many surface reactions do not lead to self-limiting behavior. For example, although a variety of oxidation techniques can be used to form a quasi-self-limiting or strictly self-limiting tungsten oxide passivation layer (such as, e.g., $WO_3$), selective dissolution of the tungsten oxide passivation layer is challenging when using strong bases (such as, e.g., potassium hydroxide, KOH, sodium hydroxide, NaOH, or calcium hydroxide ($Ca(OH)_2$)) or strong acids (such as, e.g., hydrochloric acid, HCl, nitric acid, $HNO_3$, or sulfuric acid, $H_2SO_4$) to remove the tungsten oxide passivation layer.

Strong bases and acids cause preferential grain boundaries attack, leading to a continuous etch of the tungsten surface and increasing post-etch surface roughness of the tungsten surface. To mitigate these challenges, new wet ALE chemistries and techniques are needed for etching tungsten and other transition metals.

The present disclosure provides a new wet atomic layer etch (ALE) process for etching a transition metal formed on a substrate. More specifically, the present disclosure provides various embodiments of methods that utilize new etch chemistries for etching tungsten (W) in a wet ALE process. As described in more detail below, the wet ALE processes and methods disclosed herein may use a wide variety of techniques and etch chemistries to oxidize a tungsten surface exposed on a substrate and form a self-limiting, tungsten oxide passivation layer (such as, e.g., $WO_3$) on the underlying tungsten surface (e.g., metallic W) in a surface modification step of the wet ALE process. The tungsten oxide passivation layer is then selectively removed in a dissolution step of the wet ALE process to etch the tungsten surface. In the wet ALE processes and methods disclosed herein, a ligand is added to the dissolution solution to selectively remove the tungsten oxide passivation layer and prevent the base (e.g., ammonium hydroxide, $NH_4OH$) or acid (e.g., hydrochloric acid, HCl) from attacking and removing the unmodified tungsten surface (e.g., metallic W) underlying the tungsten oxide passivation layer. This prevents continuous etching of the tungsten surface and ensures that the post-etch surface roughness is substantially equal to the initial surface roughness of the tungsten layer before etching.

Unlike conventional methods for etching tungsten, the methods disclosed herein utilize new etch chemistries for etching tungsten in a wet ALE process that provides self-limiting behavior in the oxidation and dissolution steps. As used herein, a "self-limiting" behavior, or "self-limiting" reaction, is one in which the rate of oxidation (or other reaction) goes to zero over time. In comparison to a strictly self-limiting reaction, a "quasi-limiting" reaction is one in which the rate of oxidation (or other reaction) decreases over time but does not go to zero. In the wet ALE processes and methods disclosed herein, self-limiting behavior is provided in the oxidation step by using steric hinderance of larger sized non-peroxide oxidizers (such as, APS). In addition to self-limiting oxidation, the wet ALE processes and methods disclosed herein provide self-limiting behavior in the dissolution step by adding a ligand (or reducing agent) to the dissolution solution to prevent oxidative damage and preferential grain boundaries attack on the tungsten surface.

The techniques disclosed herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques disclosed herein may be used to etch a wide variety of materials, including polycrystalline materials, single-crystalline materials and amorphous materials. In some embodiments, the techniques described herein may be used to etch a metal material such as, but not limited to, transition metals and noble metals. In one exemplary embodiment, the material to be etched may be tungsten (W). Although the techniques described herein are discussed below in reference to etching tungsten, it will be recognized by those skilled in the art that such an example is merely exemplary and the techniques described herein may be used to etch a wide variety of other materials. For example, the techniques described herein may be used to etch other transition metals such as, but not limited to, cobalt (Co), copper (Cu), molybdenum (Mo), vanadium (V), niobium (Nb), tantalum (Ta), titanium (Ti), chromium (Cr), nickel (Ni) and combinations thereof.

The techniques disclosed herein offer multiple advantages over other etch techniques used for etching transition metals. For example, the techniques disclosed herein provide the benefits of ALE, such as precise control of total etch amount, control of surface roughness, and improvements in wafer-scale uniformity. The techniques disclosed herein also provide various benefits of wet etching, such as the simplicity of the etch chamber, self-limiting reactions at near atmospheric temperature and pressure etching conditions, and reduced surface roughness. Unlike conventional etch processes used to etch transition metals, such as tungsten, the techniques disclosed herein provide a wet ALE process that provides a self-limiting oxidation step and a selective dissolution step for etching the transition metal. As such, the techniques described herein provide unique methods for etching tungsten.

FIG. 1 illustrates one embodiment of a method 100 that can be used to etch a substrate using a wet atomic layer etching (ALE) process. More specifically, FIG. 1 illustrates an embodiment of a method 100 that can be used to etch a tungsten (W) layer formed on a substrate using a wet ALE process. It will be recognized that the embodiment of FIG. 1 is merely exemplary and additional methods may utilize the wet ALE techniques described herein. Further, additional processing steps may be added to the method shown in the FIG. 1 as the steps described are not intended to be exclusive. Moreover, the order of the steps is not limited to the order shown in the figures as different orders may occur and/or various steps may be performed in combination or at the same time.

The method 100 shown in FIG. 1 includes receiving a substrate having a tungsten (W) layer formed thereon, wherein a tungsten surface is exposed on a surface of the substrate (in step 110), and exposing the surface of the substrate to a surface modification solution comprising an oxidizer dissolved in a non-aqueous solvent (in step 120). The oxidizer included within the surface modification solution reacts with the tungsten surface to oxidize the tungsten surface and form a tungsten oxide passivation layer, which is self-limiting and insoluble in the non-aqueous solvent. A wide variety of oxidizers may be included within the surface modification solution, as described in more detail below.

After forming the self-limiting tungsten oxide passivation layer, method 100 removes the surface modification solution from the surface of the substrate (in step 130), and exposes the surface of the substrate to a dissolution solution comprising a ligand to selectively remove the tungsten oxide passivation layer (in step 140). The dissolution solution reacts with the tungsten oxide passivation layer to form soluble species, which are dissolved by the dissolution solution to expose an unmodified tungsten surface underlying the tungsten oxide passivation layer. The ligand prevents the dissolution solution from attacking and removing the unmodified tungsten surface. The method 100 removes the dissolution solution and the soluble species from the surface of the substrate to etch the tungsten layer (in step 150). In some embodiments, the method may repeat steps 120-150 a number of times (in step 160) until a predetermined amount of the tungsten is removed from the substrate.

The method 100 shown in FIG. 1 can be used to etch tungsten (and other transition metals) in a wet ALE process by performing multiple cycles of the wet ALE process, wherein each cycle includes a surface modification step (step 120) to oxidize the tungsten surface and form a tungsten oxide passivation layer and a dissolution step (step 140) to selectively remove tungsten oxide passivation layer without removing the unmodified tungsten surface underlying the passivation layer. Purge steps (steps 130 and 150) are performed between the surface modification and dissolution steps to prevent the surface modification and dissolution solutions from mixing, and the process may be repeated in a cyclic manner until a desired amount of etching is achieved. Example etch chemistries that may be used in the surface modification step (step 120), the dissolution step (step 140) and the purge steps (steps 130 and 150) are described in more detail below.

Figure 2:
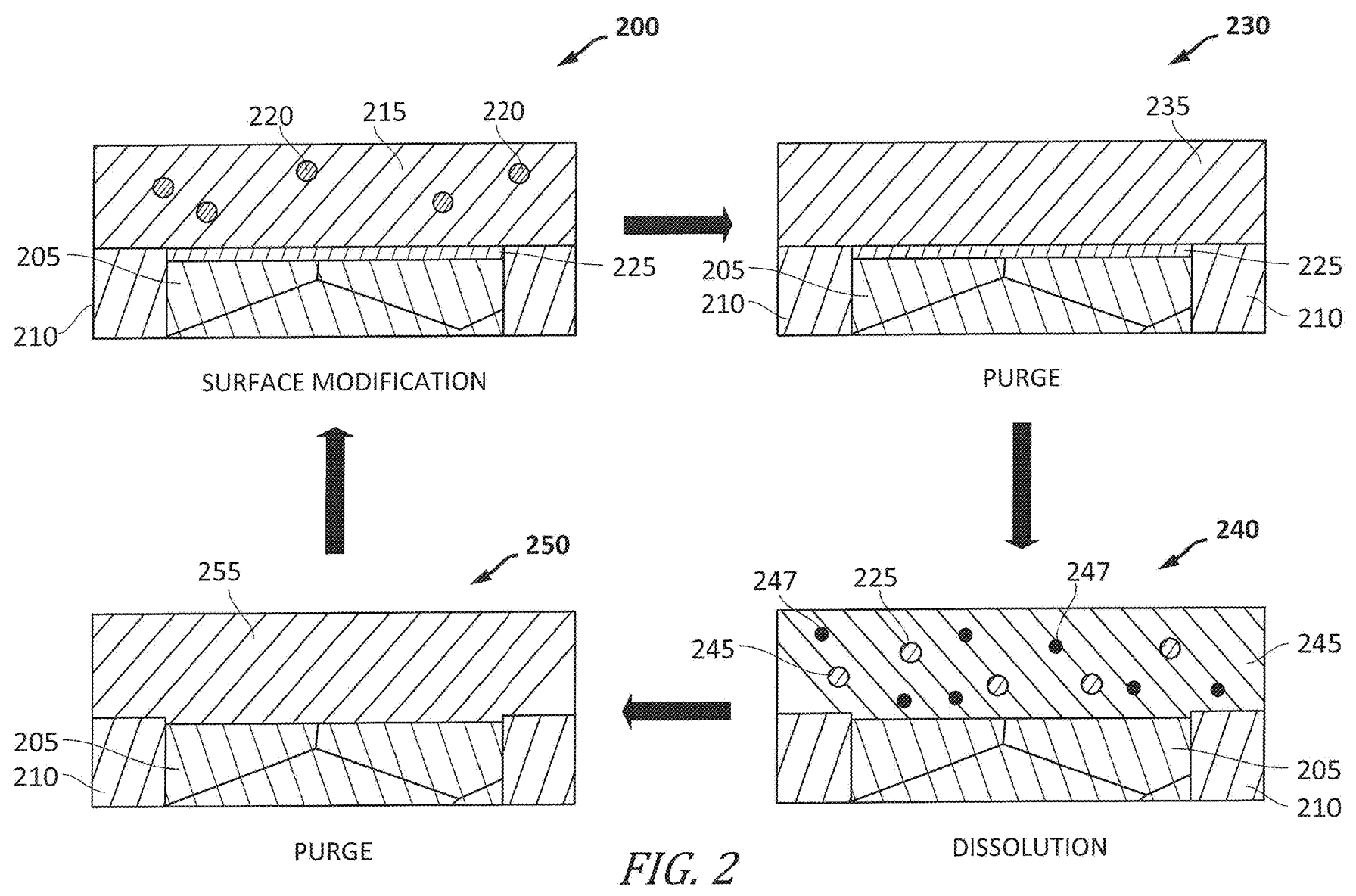

FIG. 2 illustrates one example of a wet ALE process that can be used to etch tungsten (and other transition metals) in accordance with a first embodiment of the present disclosure. As described in more detail below, the wet ALE process shown in FIG. 2 is a cyclical process consisting of one or more ALE cycles, where each ALE cycle includes a surface modification step 200, a first purge step 230, a dissolution step 240 and a second purge step 250.

In the wet ALE process shown in FIG. 2, a tungsten layer 205 surrounded by a dielectric material 210 is brought in contact with a surface modification solution 215 during the surface modification step 200. The surface modification solution 215 contains an oxidizer 220 dissolved in a non-aqueous solvent. The oxidizer 220 reacts with an exposed surface of the tungsten layer 205 to oxidize the tungsten surface and form a tungsten oxide passivation layer 225, which is self-limiting and insoluble in the non-aqueous solvent. A wide variety of oxidizers 220 and non-aqueous solvents may be used in the surface modification solution 215. For example, the oxidizer 220 may be a peroxide oxidizer (such as, e.g., hydrogen peroxide, $H_2O_2$), a non-peroxide oxidizer (such as, e.g., ammonium persulfate, APS), or an oxidizing radical (such as, e.g., a hydroxyl radical). The non-aqueous solvent may be an organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. However, other oxidizers and non-aqueous solvents may also be used in the surface modification solution 215, as described in more detail below.

After the tungsten oxide passivation layer 225 is formed in the surface modification step 200, the first purge step 230 is performed to remove the surface modification solution 215 from the surface of the substrate. In the first purge step 230, the substrate is rinsed with a first purge solution 235 to remove the surface modification solution 215 and excess reactants from the surface of the substrate. The first purge solution 235 should not react with the tungsten oxide passivation layer 225 formed during the surface modification step 200, or with the reactants in the surface modification solution 215. In some embodiments, the first purge solution 235 may use the same solvent (e.g., methanol or IPA) used in the surface modification solution 215. However, other solvents may also be utilized, as discussed in more detail below. In some embodiments, the first purge step 230 may be long enough to completely remove all excess reactants from the substrate surface.

After the substrate is rinsed, the dissolution step 240 is performed to selectively remove the tungsten oxide passivation layer 225 formed during the surface modification step 200. In the dissolution step 240, the substrate is exposed to a dissolution solution 245 containing a ligand 247 to selectively remove or dissolve the tungsten oxide passivation layer 225 without removing the unmodified tungsten layer 205 underlying the tungsten oxide passivation layer 225 or the dielectric material 210 surrounding the tungsten layer 205.

The dissolution solution 245 may be an aqueous basic solution containing a ligand and a base, or an aqueous acidic solution containing a ligand and an acid. Examples of bases that may be included within the dissolution solution 245 include, but are not limited to, ammonium hydroxide (NH$_4$OH), tetramethylammonium hydroxide (TMAH), potassium hydroxide (KOH), sodium hydroxide (NaOH) or calcium hydroxide (Ca(OH)$_2$). Examples of acids include, but are not limited to, hydrochloric acid (HCl), nitric acid (HNO$_3$) and sulfuric acid (H$_2$SO$_4$). The ligand 247 is added to the dissolution solution 245 to prevent oxidative damage on the exposed tungsten surface and prevent the base (or the acid) from attacking and removing the unmodified tungsten layer 205 underlying the tungsten oxide passivation layer 225. The ligand 247 added to the dissolution solution 245 may be a ligand and/or reducing agent, which inhibits oxidation of the unmodified tungsten layer 205. A wide variety of ligands and reducing agents may be used in the dissolution solution 245 such as, but not limited to, ascorbic acid, sodium ascorbate, calcium ascorbate or potassium ascorbate, oxalic acid, formic acid, acetic acid, ethylenediamine, ethylenediaminetetraacetic acid (EDTA) and iminodiacetic acid. Other acids, bases and ligands may also be utilized within the dissolution solution 245, as discussed in more detail below.

In order to selectively remove the tungsten oxide passivation layer 225, the tungsten oxide passivation layer 225 must be soluble, and the unmodified tungsten layer 205 underlying the tungsten oxide passivation layer 225 must be insoluble, in the dissolution solution 245. The solubility of the tungsten oxide passivation layer 225 allows its removal through dissolution into the bulk dissolution solution 245. In some embodiments, the dissolution step 240 may continue until the tungsten oxide passivation layer 225 is dissolved.

Once the tungsten oxide passivation layer 225 is dissolved within the dissolution solution 245, the wet ALE etch cycle shown in FIG. 2 may be completed by performing a second purge step 250 to remove the dissolution solution 245 from the surface of the substrate. In the second purge step 250, the substrate is rinsed with a second purge solution 255, which may be the same or different than the first purge solution 235. In some embodiments, the second purge solution 255 may use the same solvent (e.g., methanol or IPA) used within the surface modification solution 215. However, other solvents may also be utilized, as discussed in more detail below. The second purge step 250 may generally continue until the dissolution solution 245 and/or the reactants and soluble species contained with the dissolution solution 245 are completely removed from the surface of the substrate.

Wet ALE of tungsten requires the formation of a self-limiting passivation layer on the underlying unmodified tungsten layer. This passivation layer must be insoluble in the first etch solution used for its formation (i.e., surface modification solution 215), but freely soluble in a second etch solution (i.e., dissolution solution 245) used for its dissolution. The self-limiting passivation layer must be removed every cycle after its formation. The second etch solution is used to selectively dissolve the passivation layer without etching the underlying unmodified tungsten layer.

The wet ALE process shown in FIG. 2 may utilize a wide variety of oxidation techniques and etch chemistries to oxidize the tungsten surface and form the self-limiting, tungsten oxide passivation layer in the surface modification step 200. For example, the oxidizer 220 used in the wet ALE process may be: (a) a peroxide oxidizer (such as, e.g., hydrogen peroxide H$_2$O$_2$), or (b) an oxidizer having relatively large reactant molecule (such as, e.g., ammonium persulfate, APS), both of which may provide self-limiting oxidation of the tungsten surface. In some embodiments, the wet ALE process may use various oxidation techniques to control the oxidation behavior. For example, the wet ALE process may use: (a) ultra-violet (UV) photolysis of peroxide oxidizers to create oxidizing radicals, which limit oxidation of the tungsten surface and provide quasi-self-limiting oxidation behavior, or (b) ligand-assisted oxidation to change the surface chemistry of the tungsten oxide passivation layer and ensure self-limiting oxidation behavior. In ligand-assisted oxidation, a ligand species may be added to a peroxide oxidizer or a non-peroxide oxidizer to change the surface chemistry of the tungsten oxide passivation layer.

Peroxide Oxidizers

In some embodiments, the surface modification solution 215 may include: (a) a peroxide oxidizer, such as hydrogen peroxide (H$_2$O$_2$), and (b) a non-aqueous organic solvent, such as methanol (CH$_3$OH), diethyl ether ((C$_2$H$_5$)$_2$O), acetonitrile (C$_2$H$_3$N), dimethyl sulfoxide (C$_2$H$_6$OS), isopropyl alcohol (IPA), another alcohol, a ketone or an acetate. Other peroxide oxidizers and non-aqueous organic solvents may also be used within the surface modification solution 215. Instead of hydrogen peroxide, for example, the surface modification solution 215 could include symmetric organic peroxides (such as di-tert-butyl peroxide (C$_8$H$_{18}$O$_2$)), asymmetric organic peroxides (such as tert-butyl peroxybenzoate (C$_{11}$H$_{14}$O$_3$)), monoperoxides (such as tert-butyl hydroperoxide (C$_4$H$_{10}$O$_2$)), or peroxy acids (such as peroxyacetic acid, or peracetic acid, (C$_2$H$_4$O$_3$)).

In one example embodiment, the surface modification solution 215 may be a non-aqueous solution comprising hydrogen peroxide (H$_2$O$_2$) and isopropyl alcohol (IPA). Hydrogen peroxide oxidizes the tungsten surface to form a tungsten trioxide (WO$_3$) passivation layer. As described in more detail below in reference to FIG. 3, oxidation of the tungsten surface is self-limiting in a non-aqueous solution containing 0.1% H$_2$O$_2$ in IPA. Other concentrations of H$_2$O$_2$ may also be used in the surface modification solution 215 to provide self-limiting oxidation behavior. For example, the H$_2$O$_2$ concentration in the surface modification solution 215 may range between 0.05% and 1%, in some embodiments. However, H$_2$O$_2$ concentrations within the upper limits of this range may provide quasi-self-limiting oxidation behavior, which is somewhat anisotropic based on the crystallographic orientation of individual grains in the tungsten layer, leading to increased surface roughness.

UV Photolysis of Peroxide Oxidizers

In some embodiments, the wet ALE process shown in FIG. 2 may use ultra-violet (UV) photolysis to create a reactant with a very short lifetime and very high oxidation potential to perform the surface oxidation needed to form the passivation layer. During the surface modification step 200, the surface of the substrate is exposed to UV radiation to photolyze the oxidizer 220 and create oxidizing radicals, which react with the exposed surface of the tungsten layer 205 to oxidize the tungsten surface and form a tungsten oxide passivation layer 225 (e.g., a tungsten trioxide layer, $WO_3$). Because the lifetime of the oxidizing radicals created through UV photolysis is relatively short, the use of oxidizing radicals as an oxidizing reactant limits oxidation of the tungsten surface to provide quasi-self-limiting oxidation behavior.

A wide variety of oxidizing radicals 222 can be formed by UV photolysis of peroxides. When hydrogen peroxide ($H_2O_2$) is used as the oxidizer 220, for example, UV photolysis of the oxidizer 220 creates hydroxyl radicals, which oxidize the tungsten surface to form a tungsten trioxide ($WO_3$) passivation layer. However, other peroxides will form other types of oxidizing radicals when photolyzed. For example, UV organic peroxides will form alkoxy radicals (e.g., di-tert-butyl peroxide is photolyzed to tert-butoxy radicals) and peroxy acids will form both hydroxyl radicals and acidoxy radicals (e.g., peracetic acid will form hydroxyl and acetoxy radicals) when photolyzed. The oxidizing radicals formed from any of these peroxides can be used to oxidize the tungsten surface and create a quasi-self-limiting tungsten oxide passivation layer 225.

Steric Hindrance of Oxidizers

In some embodiments, the wet ALE process shown in FIG. 2 may form a tungsten oxide passivation layer 225 by using the steric hinderance of a larger sized oxidizer 220 to prevent the continuous etch process that sometimes occurs with oxidizers having smaller reactant molecules. A larger reactant molecule (e.g., a reactant molecule having a molecular size, or radical length, substantially greater than 2 Å) has a smaller diffusion coefficient than a smaller reactant molecule (e.g., a reactant molecule having a molecular size, or radical length, less than 2 Å). This will result in a slower sub-surface oxidation rate, but also a slower unwanted continuous dissolution rate during the formation of the passivation layer. Thus, by using an oxidizer 220 having a larger reactant molecule, the wet ALE process shown in FIG. 2 improves the self-limiting behavior of the tungsten oxide passivation layer 225 by reducing the oxidation rate of the tungsten surface during the surface modification step 200.

In some embodiments, the surface modification solution 215 may include: (a) an oxidizer 220 having a larger reactant molecule, and (b) a non-aqueous organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. In some embodiments, the relative difference between "larger" and "smaller" reactant molecules may be quantified by comparing the molecular size of the reactant molecule in the oxidizer 220 with the molecular size of the reactant molecule in hydrogen peroxide ($H_2O_2$). For example, the hydroxide radical in hydrogen peroxide ($H_2O_2$) has a bond length of approximately 1.0 angstroms (Å) and a radical length of approximately 1.5 angstroms (Å). In comparison, the oxidizing radical (or reactant molecule) in the oxidizer 220 may have a substantially greater radical length than that of the hydroxide radical. For example, the oxidizing radical in the oxidizer 220 may have a radical length that is substantially greater than 2 angstroms (Å), or a radical length of at least twice the size of the hydroxide radical, in some embodiments. Examples of oxidizers having a larger reactant molecule (e.g., a reactant molecule having a molecular size, or radical length, substantially greater than 2 Å) include, but are not limited to, non-peroxide oxidizers and certain organic peroxides.

In some embodiments, the surface modification solution 215 may include a non-peroxide oxidizer having a larger reactant molecule than that of hydrogen peroxide ($H_2O_2$). Ammonium persulfate (APS) and ferric chloride ($FeCl_3$) are examples of non-peroxide oxidizers having larger reactant molecules than hydrogen peroxide ($H_2O_2$). The reactant molecule in APS is the sulfate radical ($SO_4$·$^-$), which has a bond length of 1.5 angstroms (Å) and a radical length of approximately 3.6 angstroms (Å). Compared to the hydroxide radical in hydrogen peroxide, the sulfate radical in APS is roughly 2.4 times larger than the hydroxide radical. Likewise, the reactant molecule in ferric chloride ($FeCl_3$) has a bond length of 2.3 angstroms (Å), and thus, an even greater radical length than the hydroxide radical.

In one example embodiment, the surface modification solution 215 may be a non-aqueous solution comprising ammonium persulfate (APS) and methanol ($CH_3OH$). APS dissolved in methanol oxidizes the surface of the tungsten layer 205 to form a tungsten trioxide ($WO_3$) passivation layer. As described in more detail below in reference to FIG. 3, oxidation of the tungsten surface is self-limiting in a non-aqueous solution containing 0.1-0.2% APS in methanol. However, other concentrations of APS may also be used in the surface modification solution 215 to provide self-limiting oxidation behavior. For example, the APS concentration in the surface modification solution 215 may range between 0.005% and 0.1%, in some embodiments.

Although APS and methanol are provided herein as examples, other oxidizers and non-aqueous solvents may also be utilized in the surface modification solution 215. For example, the surface modification solution 215 may be a non-aqueous solution comprising ferric chloride ($FeCl_3$) and isopropyl alcohol (IPA) or acetone ($C_3H_6O$). Ferric chloride dissolved in IPA (or acetone) may oxidize the surface of the tungsten layer 205 to form a tungsten chloride (e.g., $WCl_x$) or tungsten oxychloride (e.g., $WO_yCl_{(x-2y)}$) passivation layer. Using ferric chloride dissolved in IPA or acetone as the oxidizer 220 ensures self-limiting oxidization behavior by forming a passivation layer (e.g., a $WCl_x$ or $WO_yCl_{(x-2y)}$ passivation layer), which is strictly self-limiting and insoluble in the non-aqueous solvent (IPA or acetone) used in the surface modification solution 215.

In addition to non-peroxide oxidizers (such as APS and $FeCl_3$), other oxidizers having a substantially larger reactant module (e.g., a reactant molecule have a molecular size, or radical length, substantially greater than 2 Å) may also be used in the surface modification solution 215. For example, symmetric organic peroxides (such as di-tert-butyl peroxide ($C_8H_{18}O_2$)) and asymmetric organic peroxides (such as tert-butyl peroxybenzoate ($C_{11}H_{14}O_3$)) can be used to achieve better self-limiting oxidation behavior by leveraging steric hinderance.

Ligand-Assisted Oxidation

In some embodiments, the wet ALE process shown in FIG. 2 may use ligand-assisted oxidation to control the reaction product and avoid forming oxidation products that are soluble in the surface modification solution 215. For example, the surface modification solution 215 may include: (a) an oxidizer 220 and a ligand species dissolved in a non-aqueous solvent, and (b) a non-aqueous organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate. The oxidizer 220 reacts with the surface of the tungsten layer 205 to oxidize the tungsten layer 205 and form the tungsten oxide passivation layer 225. The ligand species added to the oxidizer 220 reacts with and binds to the tungsten oxide passivation layer 225 to change the surface chemistry of the tungsten oxide passivation layer 225. Changing the surface chemistry of the tungsten oxide passivation layer 225 ensures self-limiting oxidation behavior by rendering the tungsten oxide passivation layer 225 insoluble in the surface modification solution 215. This prevents the evolution of surface roughness with etch amount, resulting in well-controlled etch uniformity within wafer and from wafer to wafer. The use of ligand binding in the oxidation/surface modification step 200 also prevents preferential grain boundary etching, resulting in better post-etch morphology.

The oxidizer 220 used in this embodiment may include any of the peroxide oxidizers and non-peroxide oxidizers mentioned above. In one embodiment, the oxidizer 220 may be ammonium persulfate (APS), the ligand species may be a carboxylate acid (such as oxalic acid) and the non-aqueous solvent may be an organic solvent (such as methanol). APS dissolved in methanol oxidizes the surface of the tungsten layer 205 to form a tungsten oxide passivation layer 225 (such as, e.g., tungsten trioxide, $WO_3$). The ligand species (e.g., oxalic acid) reacts with and binds to the tungsten surface to change the surface chemistry of the tungsten oxide passivation layer 225. Changing the surface chemistry of the tungsten oxide passivation layer 225 ensures self-limiting oxidation behavior by forming a surface species (e.g., oxytungsten oxalate), which is insoluble within the non-aqueous solvent (for example, methanol) included within the surface modification solution 215, but soluble with the dissolution solution 245.

Although APS, oxalic acid and methanol are provided herein as examples, other oxidizers, ligand species and non-aqueous solvents may also be utilized in the surface modification solution 215. For example, the surface modification solution 215 may include: (a) a peroxide oxidizer, such as hydrogen peroxide ($H_2O_2$), di-tert-butyl peroxide ($C_8H_{18}O_2$), tert-butyl peroxybenzoate ($C_{11}H_{14}O_3$), tert-butyl hydroperoxide ($C_4H_{10}O_2$), or peroxyacetic acid ($C_2H_4O_3$), or a non-peroxide oxidizer, such as ammonium persulfate (APS), ferric chloride ($FeCl_3$), osmium and ruthenium tetroxides, ruthenates, manganates, permanganates, periodates (and other halide oxyanions), and metal nitrates (such as, e.g. ceric ammonium nitrate), (b) a ligand species, such as oxalic acid, acetic acid, ascorbic acid, mandelic acid, malic acid, maleic acid or fumaric acid, and (c) a non-aqueous organic solvent, such as methanol ($CH_3OH$), diethyl ether (($C_2H_5)_2O$), acetonitrile ($C_2H_3N$), dimethyl sulfoxide ($C_2H_6OS$), isopropyl alcohol (IPA), another alcohol, a ketone or an acetate.

After forming a tungsten oxide passivation layer 225 using one or more of the oxidation techniques disclosed herein, the wet ALE process shown in FIG. 2 may utilize a wide variety of etch chemistries to selectively remove the tungsten oxide passivation layer 225 in the dissolution step 240 without etching the unmodified tungsten layer 205 (e.g., metallic W) underlying the tungsten oxide passivation layer 225. For example, the wet ALE process may use ligand-assisted dissolution to control the dissolution of the tungsten oxide passivation layer 225, prevent continuous etching of the tungsten layer 205, and improve the post-etch surface roughness of the tungsten surface.

Ligand-Assisted Dissolution

As noted above, the dissolution solution 245 may be: (i) an aqueous basic solution containing a ligand 247 and a base, or (ii) an aqueous acidic solution containing a ligand 247 and an acid. The base (or acid) included within the dissolution solution 245 removes the tungsten oxide passivation layer 225 to expose the unmodified tungsten layer 205 underlying the tungsten oxide passivation layer 225. Examples of bases that may be included within the dissolution solution 245 include, but are not limited to, ammonium hydroxide ($NH_4OH$), tetramethylammonium hydroxide (TMAH), potassium hydroxide (KOH), sodium hydroxide (NaOH) or calcium hydroxide ($Ca(OH)_2$). Examples of acids include, but are not limited to, hydrochloric acid (HCl), nitric acid ($HNO_3$) and sulfuric acid ($H_2SO_4$).

In the embodiments disclosed herein, a ligand 247 is added to the dissolution solution 245 to prevent oxidative damage on the exposed tungsten surface and prevent the base (or the acid) from attacking and removing the unmodified tungsten layer 205 underlying the tungsten oxide passivation layer 225. In some embodiments, the ligand 247 added to the dissolution solution 245 may react with and bind to the unmodified tungsten layer 205 to change the surface chemistry of the unmodified tungsten layer 205. In doing so, the ligand 247 may prevent parasitic oxidation of the unmodified tungsten layer 205 by blocking the unmodified tungsten surface. In other embodiments, the ligand 247 added to the dissolution solution 245 may be a reducing agent that inhibits oxidation of the unmodified tungsten surface. As known in the art, a "reducing agent" is a chemical species that reduces another element, molecule or compound by donating an electron to the other element, molecule or compound (i.e., an electron recipient) during an oxidation-reduction reaction. During the reaction, the reducing agent loses an electron to, and absorbs oxygen from, the electron recipient. In doing so, the reducing agent becomes oxidized and the electron recipient becomes reduced (by losing an oxygen). By adding the ligand 247 (or reducing agent) to the dissolution solution 245, the wet ALE process shown in FIG. 2 inhibits oxidation of the unmodified tungsten surface and prevents continuous etching of the tungsten layer 205 during the dissolution step 240. This enables the wet ALE process to provide a post-etch surface roughness of the tungsten layer 205 that is substantially equal to an initial surface roughness of the tungsten layer 205 before etching.

A wide variety of ligands may be added to the dissolution solution 245. In some embodiments, the ligand 247 added to the dissolution solution 245 may contain an ascorbate anion. For example, the ligand 247 may be ascorbic acid ($C_6H_8O_6$), sodium ascorbate ($C_6H_7NaO_6$), calcium ascorbate ($C_{12}H_{14}CaO_{12}$) or potassium ascorbate ($KC_6H_7O_6$). Ascorbic acid is a water-soluble organic acid, whose conjugate base is the ascorbate anion. The ascorbate anion is a mild reducing agent and antioxidant (a compound that inhibits oxidation) that forms water-soluble salts when exposed to various metals, such as sodium ascorbate, calcium ascorbate and potassium ascorbate. On exposure to oxygen, ascorbic acid will undergo further oxidative decomposition to form various products such as, for example, oxalic acid. Ligands containing ascorbate anions (such as, e.g., ascorbic acid) prevent continuous etching of the tungsten layer 205 during the dissolution step 240 by preventing oxidative damage on the exposed tungsten surface and preventing the base (or the acid) from attacking and removing the unmodified tungsten layer 205. However, other reducing agents can also be used to prevent continuous etching of the tungsten layer during the dissolution step. For example, carboxylic acids (such as, e.g., oxalic acid ($C_2H_2O_4$), formic acid (HCOOH), acetic acid ($CH_3COOH$), etc.), amine-containing ligands (such as, e.g., ethylenediamine ($C_2H_8N_2$), ethylenediaminetetraacetic acid (EDTA, $C_{10}H_{16}N_2O_8$), iminodiacetic acid ($C_4H_7NO_4$) etc.) or other molecules that bind to the tungsten metal surface through N, P, O, or S heteroatoms can also be used in the dissolution solution 245. Although several different types of reducing agents may be used, ligands containing ascorbate anions (such as, e.g., ascorbic acid) may enable higher etch rates than ligands containing other anions (such as, e.g., formate anions, oxalate anions, etc.), and thus, may be preferred in some embodiments.

In addition to the ligand 247, the dissolution solution 245 may contain a base or an acid. In some embodiments, the dissolution solution 245 may be an aqueous basic solution comprising: (i) the ligand 247, and (ii) ammonium hydroxide ($NH_4OH$), tetramethylammonium hydroxide (TMAH), potassium hydroxide (KOH) or calcium hydroxide ($Ca(OH)_2$). In other embodiments, the dissolution solution 245 may be an aqueous acidic solution comprising: (i) the ligand 247, and (ii) hydrochloric acid (HCl), nitric acid or sulfuric acid.

In one preferred embodiment, an aqueous basic solution comprising a ligand 247 and a base may be used in the dissolution solution 245 to selectively remove a tungsten trioxide ($WO_3$) passivation layer. The base removes the tungsten trioxide ($WO_3$) passivation layer to expose the unmodified tungsten surface underlying the passivation layer. The ligand 247 prevents the base from attacking and removing the unmodified tungsten surface and increasing the post-etch surface roughness of the tungsten layer 205 compared to the initial surface roughness of the tungsten layer 205 before etching. The amount of ligand 247 needed to prevent parasitic etch of the unmodified tungsten surface depends on the concentration of the base included within the dissolution solution 245. In some embodiments, the dissolution solution 245 may be an aqueous basic solution comprising 0 mM to 10 mM ascorbic acid dissolved in 0.05 mM to 1M of ammonium hydroxide ($NH_4OH$) and water. In one example implementation, 10 mM of ascorbic acid dissolved in 2-100 mM of $NH_4OH$ may be used in the dissolution solution 245 to provide self-limiting dissolution. However, other ligands, bases and ligands may be used in the dissolution solution 245 to prevent continuous etching of the tungsten layer 205 and preserve post-etch surface roughness.

Experimental Results

Etching experiments were conducted on 15 mm×15 mm coupons cut from a 300 mm silicon wafer with various thicknesses of tungsten deposited by physical vapor deposition (PVD) on one side to investigate the wet ALE process shown in FIG. 2. The etching experiments used to etch an exposed tungsten surface included multiple wet ALE cycles, where each cycle includes a dip in a surface modification solution 215 containing various concentrations of ammonium persulfate (APS) dissolved in methanol or hydrogen peroxide ($H_2O_2$) dissolved in isopropyl alcohol (IPA), followed by a methanol or IPA rinse, a dip in a dissolution solution 245 containing various ligands (e.g., ascorbic acid, sodium ascorbate or oxalic acid) dissolved in various concentrations of ammonium hydroxide ($NH_4OH$) and water, and a methanol or IPA rinse and blow dry. Each wet ALE process was repeated for a number of ALE cycles under different process conditions to investigate the etch rate achieved by the wet ALE process shown in FIG. 2 using various oxidation and dissolution chemistries. Additional etching experiments were conducted to investigate the effect that: (a) oxidation temperature, concentration and time, (b) dissolution concentration and time, and (c) ligand choice and concentration have on the etch rate.

The graph 300 shown in FIG. 3 depicts exemplary etch amounts (expressed in nanometers, nm) achieved over time (expressed in minutes, min) when etching a tungsten (W) surface using various surface modification solutions in the wet ALE process shown in FIG. 2. To obtain the results shown in the graph 300, the tungsten surface was exposed to three different surface modification solutions for a variable length of time (e.g., 0-10 minutes) to oxidize the tungsten surface and form a tungsten oxide passivation layer. Specifically, the tungsten surface was exposed to 0.2% APS in methanol solution, 0.1% APS in methanol solution and 0.1% $H_2O_2$ in IPA solution in three separate wet ALE processes. After performing the surface modification, rinse and dissolution steps, and repeating each wet ALE process for a number of cycles, 4-point probe (4pp) resistivity measurements were obtained to measure the etch amount achieved by the wet ALE processes. As shown in the graph 300, oxidation of the tungsten surface is self-limiting in both APS and $H_2O_2$. When oxidation is performed in the APS solution at an elevated temperature (e.g., 40° C.), the self-limiting behavior is preserved, while the etch rate is increased.

Figure 4A:
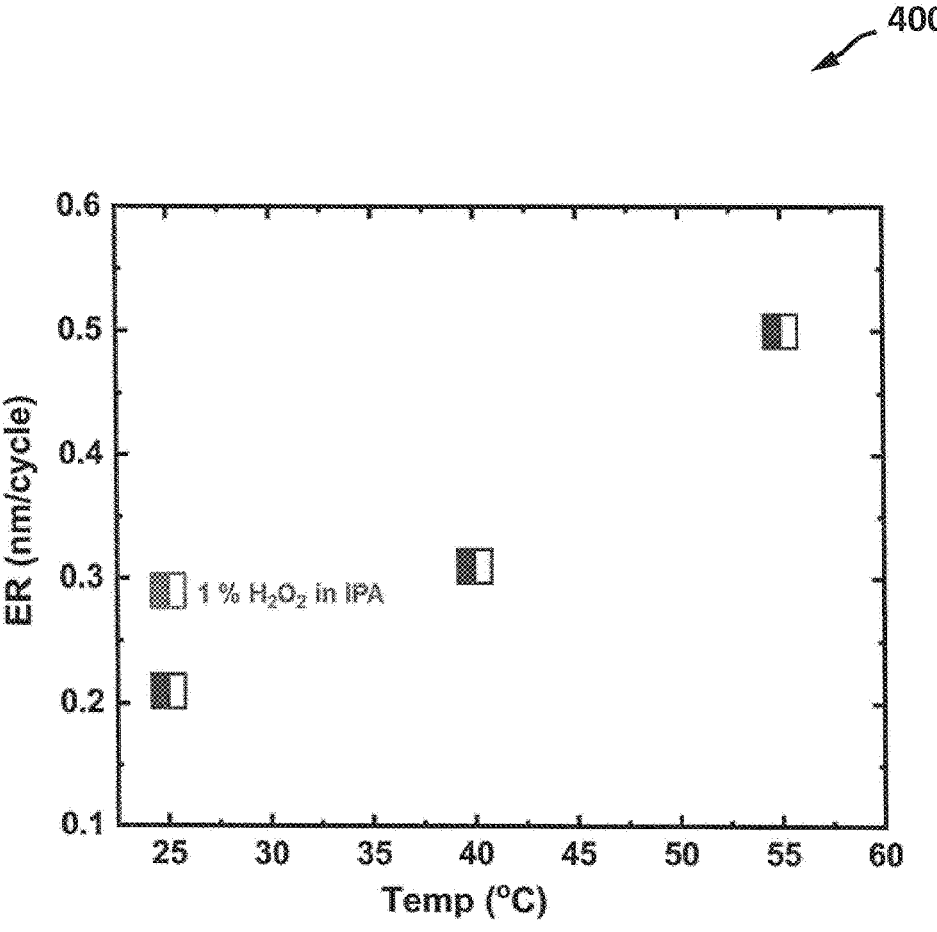
FIG. 4A is a graph depicting the effect of oxidation temperature (expressed in ° C.) on etch rate (expressed in nm/cycle) when etching a tungsten surface using various surface modification solutions and oxidation temperatures.

The graph 400 shown in FIG. 4A illustrates the effect of oxidation temperature (expressed in ° C.) on etch rate (expressed in nm/cycle) when etching a tungsten surface using various surface modification solutions and oxidation temperatures. Etching experiments were conducted to investigate the tungsten etch rate as a function of oxidation temperature using two different surface modification solutions: 1% APS in methanol and 1% $H_2O_2$ in IPA. While the oxidation step can be performed over a wide range of oxidation temperatures, the maximum oxidation temperature is limited to the lower value between the boiling point of the solvent (e.g., methanol or IPA) or the decomposition temperature of the oxidizer (e.g., APS or $H_2O_2$). For the 1% APS in methanol chemistry, the maximum oxidation temperature is the boiling point of methanol at 65° C. The etch recipe used to obtain the results shown in the graph 400 included multiple ALE cycles, where each cycle includes: (a) a 10 second dip in 1% APS in methanol solution (or 1% $H_2O_2$ in IPA solution), (b) a methanol (or IPA) rinse, (c) a 10 second dip in a dissolution solution comprising 2 mM $NH_4OH$ and 10 mM ascorbic acid (or 100 mM $NH_4OH$ and 10 mM ascorbic acid), and (d) a methanol (or IPA) rinse. The etching experiments were performed at 25° C., 40° C. and 55° C. for the 1% APS in methanol solution, and at 25° C. for 1% $H_2O_2$ in IPA solution.

As shown in the graph 400, APS and $H_2O_2$ can both oxidize the tungsten surface to form a tungsten oxide passivation layer, which can be dissolved in a dissolution solution containing $NH_4OH$ and ascorbic acid. The etch rate achieved using the 1% APS in methanol surface modification solution increases with oxidation temperature (e.g., ~0.21 nm/cycle at 25° C., ~0.31 nm/cycle at 40° C., and ~0.5 nm/cycle at 55° C.). The increase in etch rate at elevated temperatures suggests that surface oxidation kinetics increase with temperature, leading to the formation of a thicker oxide layer. The graph 400 further shows that the etch rate (~0.29 nm/cycle) in the 1% $H_2O_2$-IPA solution is higher than the etch rate (~0.21 nm/cycle) achieved in the 1% APS-methanol solution at room temperature (25° C.).

Figure 4B:
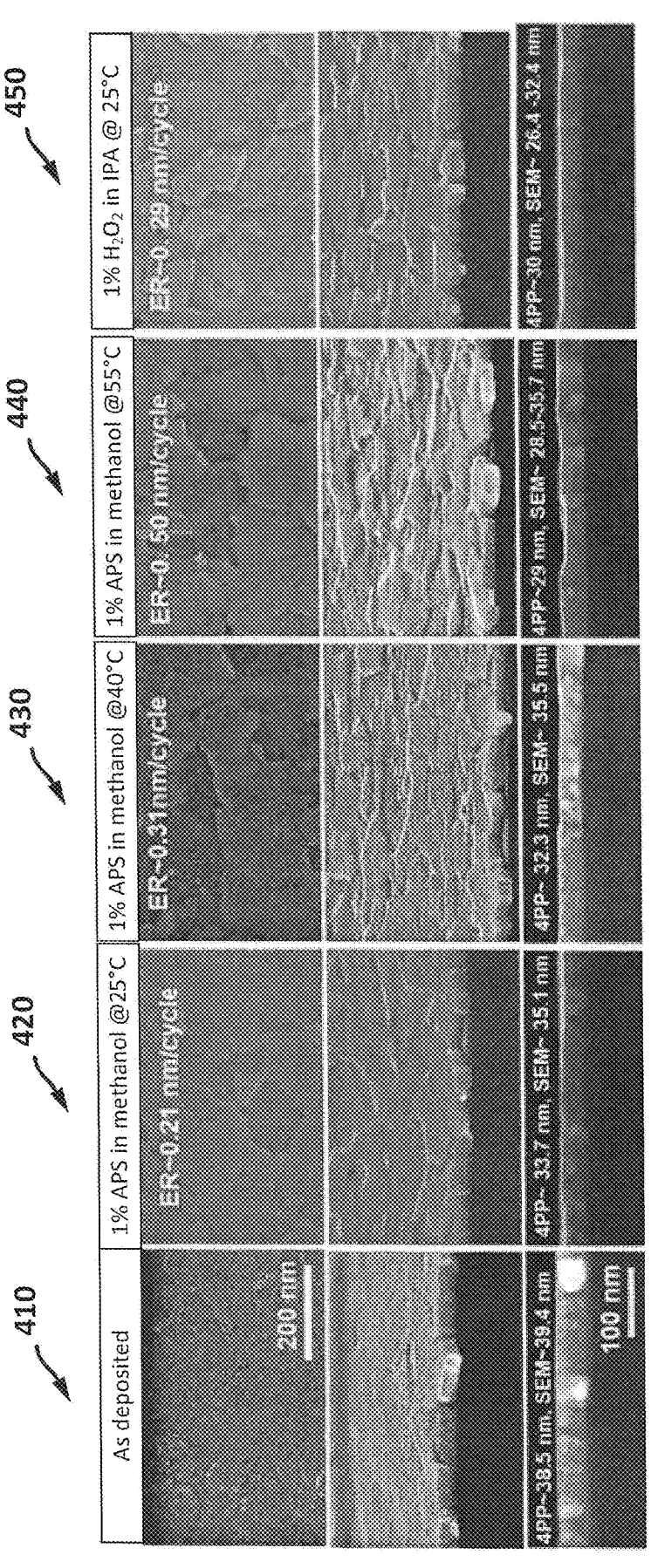
FIG. 4B provides scanning electron microscope (SEM) images depicting as-deposited tungsten and post-etch tungsten surfaces for the various etch conditions shown in FIG. 4A, illustrating the effect of oxidation temperature on the post-etch surface roughness.

Top down and tilt view scanning electron microscope (SEM) images of as-deposited tungsten (410) and post-etch tungsten (420, 430, 440, 450) were obtained for the various etch conditions shown in FIG. 4A to investigate the effect of oxidation temperature on the post-etch surface roughness. The SEM images 410-450 are shown in FIG. 4B. In the post-etch SEM images (420, 430, 440 and 450), the etch amount was calculated from 4-point probe (4pp) resistivity measurements of the tungsten film and the etch amount measured by SEM cross section are in good agreement. The variation in the cross-sectional tungsten thickness measured from 4-point probe measurement method with the thickness measured from the SEM cross section suggest anisotropic etch in all four coupons. The anisotropy in the tungsten etch increases with both the oxidizing temperature and the etch amount. The escalation in tungsten oxide thickness, as well as the rate at which the oxidizer oxidizes the tungsten surface, may be attributed to both the increased etch rate (ER) and post-etch surface roughness. The variation in the distance between metal layers in different crystallographic orientations of tungsten may cause different oxide thickness during the oxidation process. Removal of uneven oxide from different layers enhances the anisotropy with etch amount.

Figure 5A:
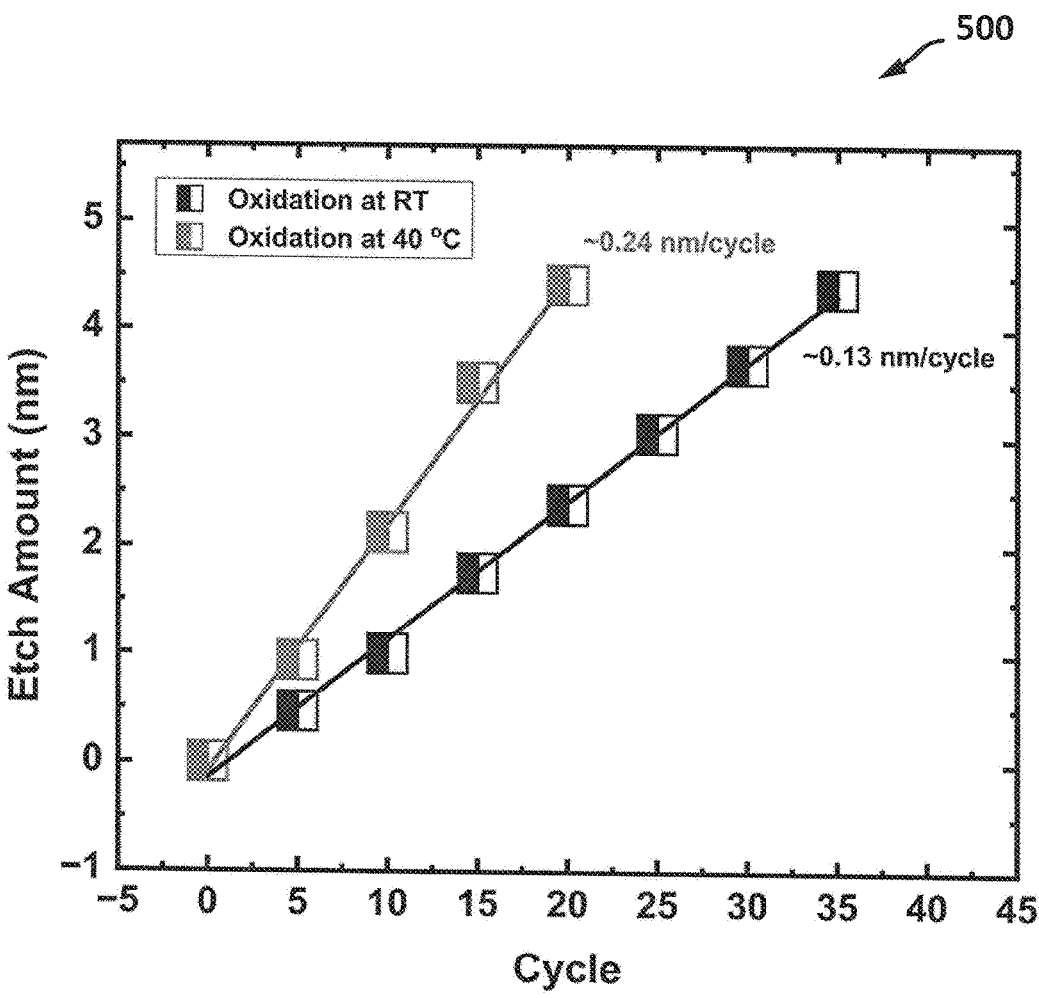
FIG. 5A a graph depicting the effect of oxidation temperature (expressed in ° C.) on etch amount (expressed in nm) when etching a tungsten surface using 0.1% ammonium persulfate (APS) dissolved in methanol ($CH_3OH$) in the surface modification solution at various temperatures (e.g., room temperature and 40° C.).

To minimize the anisotropic tungsten etch, additional etch experiments were carried out using a significantly lower oxidizer concentration. The graph 500 shown in FIG. 5A depicts the effect of oxidation temperature (expressed in ° C.) on etch amount (expressed in nm) when etching a tungsten surface using 0.1% APS dissolved in methanol at 25° C. and 40° C. The etch recipe used to obtain the results shown in the graph 500 included multiple ALE cycles, where each cycle includes a 10 second dip in 0.1% APS in methanol solution at 25° C. or 40° C., followed by a methanol rinse, a 10 second dip in a dissolution solution comprising 2 mM $NH_4OH$, and a methanol rinse. As shown in the graph 500, the etch rate nearly doubles (e.g., ~0.13 nm/cycle vs ~0.24 nm/cycle) when the oxidation temperature is increased from about 25° C. to about 40° C. As noted above, the increase in etch rate can be attributed to the formation of a thicker oxide layer, due to enhanced oxidation kinetics at higher temperatures.

Figure 5B:
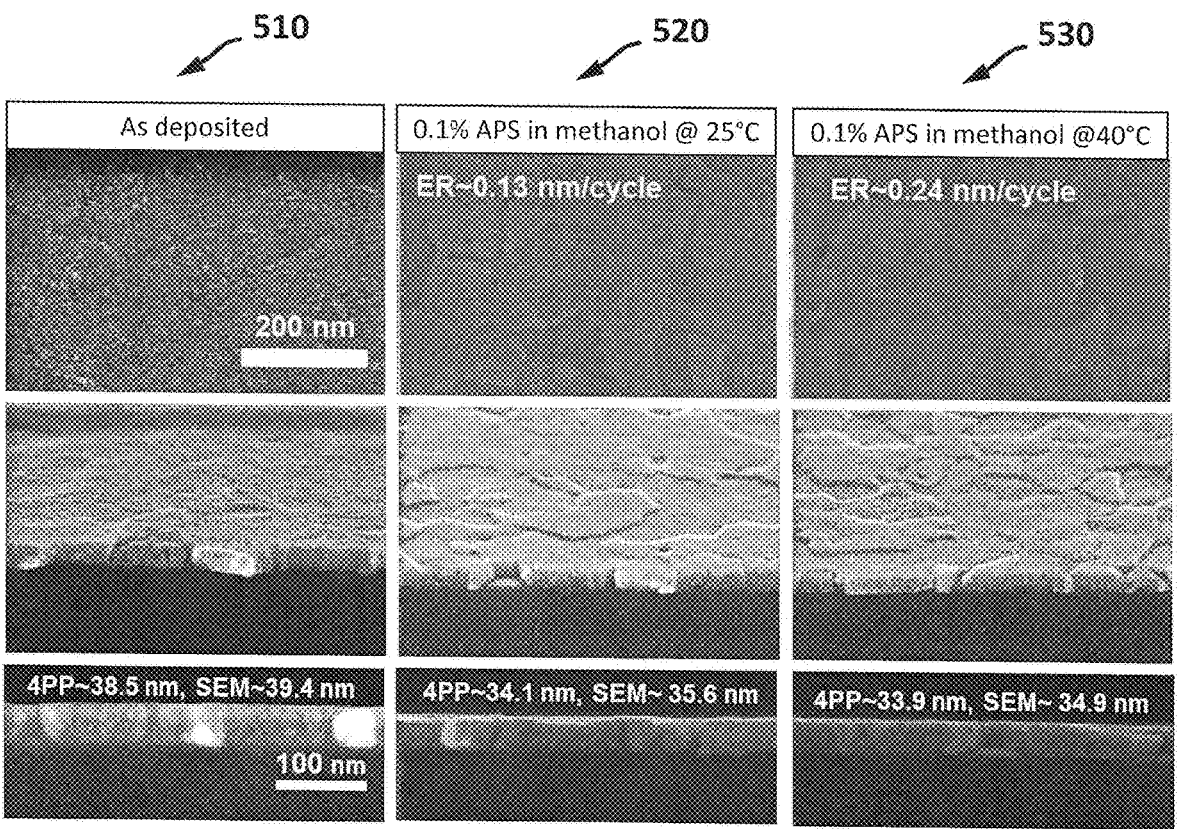
FIG. 5B provides SEM images depicting as-deposited tungsten and post-etch tungsten surfaces for the various etch conditions shown in FIG. 5A, illustrating the effect of oxidation temperature on the post-etch surface roughness.

Additional SEM images of as-deposited tungsten (510) and post-etch tungsten (520 and 530) were obtained for the various etch conditions shown in FIG. 5A to illustrate the effect of oxidation temperature on the post-etch surface roughness using the 0.1% APS methanol solution. The SEM images 510-530 are shown in FIG. 5B. In the post-etch SEM images (520 and 530), the etch amount was calculated from 4-point probe (4pp) resistivity measurements of the tungsten film and the etch amount measured by SEM cross section are in good agreement. The SEM images depicted in FIG. 5B shown that, while anisotropy in the tungsten etch exists, the post-etch surface morphology is nearly the same for both oxidation temperatures.

Figure 6A:
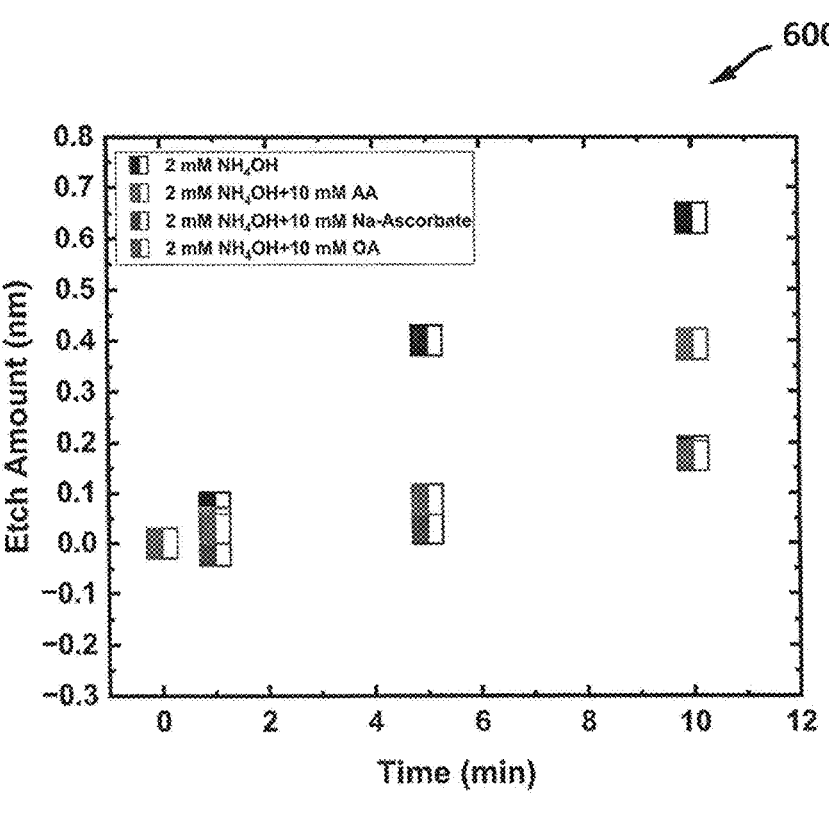
FIG. 6A is a graph depicting exemplary etch amounts (expressed in nm) that may be achieved over time (expressed in min) when etching a tungsten surface using various dissolutions solutions in the wet ALE process shown in FIG. 2.

The graph 600 shown in FIG. 6A depicts exemplary etch amounts (expressed in nm) achieved over time (expressed in min) when etching a tungsten surface using various dissolutions solutions (with and without ligands) in the wet ALE process shown in FIG. 2. To obtain the results shown in the graph 600, the tungsten surface was exposed to three different dissolution solutions for a variable length of time (e.g., 0-10 minutes) to remove a tungsten oxide passivation layer formed by dipping the coupons in a 0.1% APS in methanol solution at 40° C. In these etch experiments, the tungsten surface was exposed to a 2 mM $NH_4OH$ solution (no ligand), a 2 mM $NH_4OH$ and 10 mM ascorbic acid solution, a 2 mM $NH_4OH$ and 10 mM sodium ascorbate solution and a 2 mM $NH_4OH$ and 10 mM oxalic acid in fourth separate wet ALE processes. After performing the surface modification, rinse and dissolution steps, and repeating each wet ALE process for a number of cycles, 4-point probe (4pp) resistivity measurements were obtained to measure the etch amount achieved by the wet ALE processes. As shown in the graph 600, the etch rate for the tungsten coupon soaked in the 2 mM $NH_4OH$ solution (no ligand) steadily increases with soak time, suggesting a continuous etch of the tungsten surface. The addition of ascorbic acid, sodium ascorbate and oxalic acid in the 2 mM $NH_4OH$ solution suppresses the continuous etch up to about 5 minutes. However, further soaking of the tungsten coupon in the dissolution solution leads to a continuous etch.

Figure 6B:
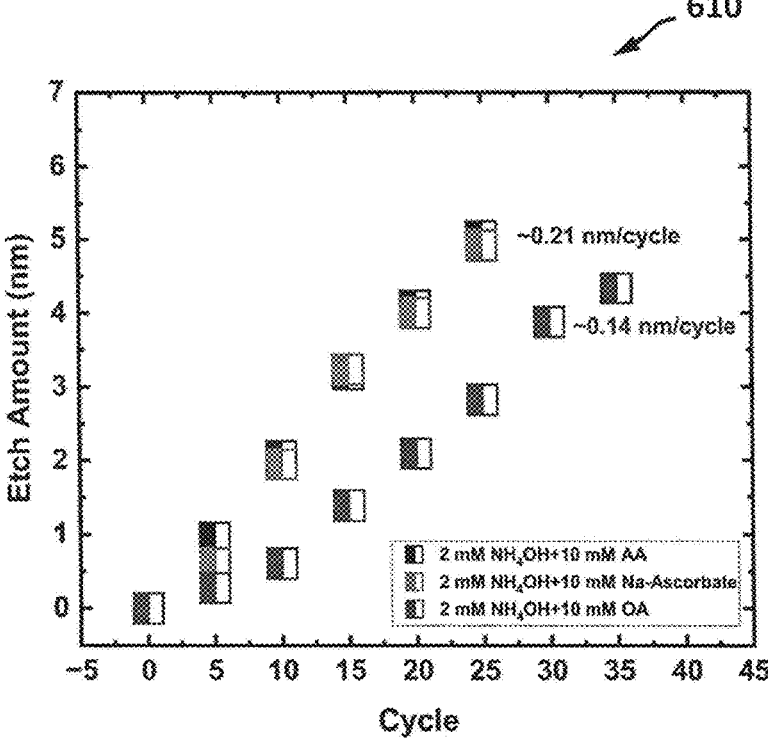
FIG. 6B is a graph depicting exemplary etch amounts (expressed in nm) that may be achieved per cycle (expressed in cycle number) when etching a tungsten surface using the various dissolutions solutions shown in FIG. 6A, illustrating the effect that adding a ligand (e.g., ascorbic acid, sodium ascorbate or oxalic acid) to the dissolution has on etch rate.

Additional etch experiments were performed to investigate the effect that adding various ligands (e.g., ascorbic acid, sodium ascorbate and oxalic acid) to the dissolution solution has on the tungsten etch rate. The graph 610 shown in FIG. 6B depicts exemplary etch amounts (expressed in nm) achieved per ALE cycle (expressed in cycle number) when using the various ligand-containing dissolutions solutions shown in FIG. 6A after oxidizing the tungsten coupons in 0.1% APS-methanol solution at 40° C. Despite the slight variation in the pH of the dissolution solutions containing ascorbic acid and sodium ascorbate (e.g., 9.24 and 10.49, respectively), the tungsten etch rate (~0.21 nm/cycle) is the same when the tungsten oxide passivation layer is dissolved in the dissolutions solutions containing ascorbate anions. However, dissolution of the tungsten oxide passivation layer is less favorable in the more acidic 2 mM $NH_4OH+10$ mM oxalic acid solution, which has a pH of 3.92, and leads to a lower tungsten etch rate (~0.14 nm/cycle).

Ascorbic acid is a well-known antioxidant and reducing agent. It may also act as a ligand, or change the pH, when added to a low concentration $NH_4OH$ solution. Thus, adding ascorbic acid (or other ligands containing ascorbate anions) to the dissolution solution may prevent oxidative damage and preferential grain boundaries attack on the tungsten surface, thereby greatly improving the post-etch morphology.

Figure 7A:
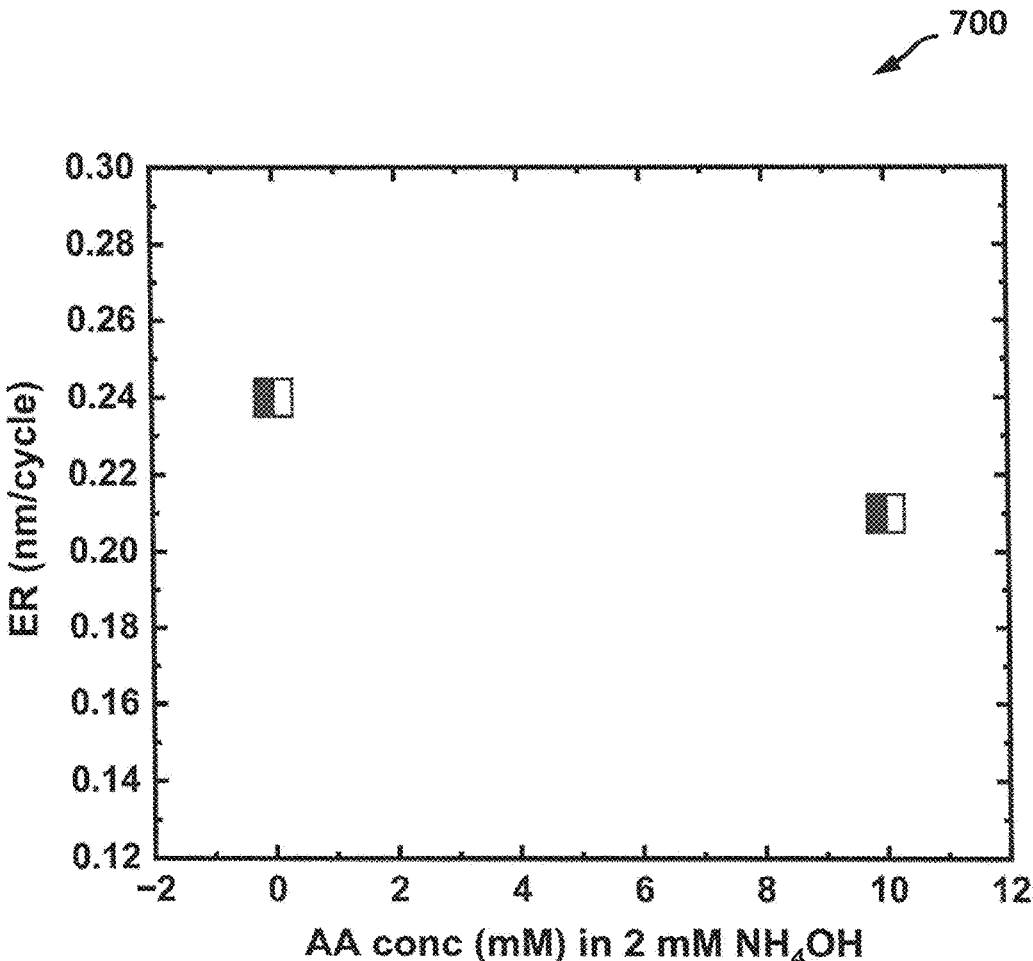
FIG. 7A is a graph depicting exemplary etch rates (expressed in nm/cycle) that may be achieved when etching a tungsten surface using different concentrations of ascorbic acid (AA, expressed in mM) in a dissolution solution comprising 2 mM of ammonium hydroxide ($NH_4OH$).

The graph 700 shown in FIG. 7A depicts exemplary etch rates (expressed in nm/cycle) achieved when etching a tungsten surface using different concentrations of ascorbic acid (AA, expressed in mM) in a 2 mM $NH_4OH$ solution. The etch recipe used to obtain the results shown in the graph 700 included multiple ALE cycles, where each cycle includes a 10 second dip in 0.1% APS in methanol solution at 40° C., followed by a methanol rinse, a 10 second dip in a dissolution solution comprising 2 mM $NH_4OH$ and either 0 mM or 10 mM of ascorbic acid, and a methanol rinse. As shown in the graph 700, the tungsten etch rate decreases slightly (e.g., from ~0.24 nm/cycle to ~0.21 nm/cycle) when 10 mM of ascorbic acid is added to the dissolution solution.

Figure 7B:
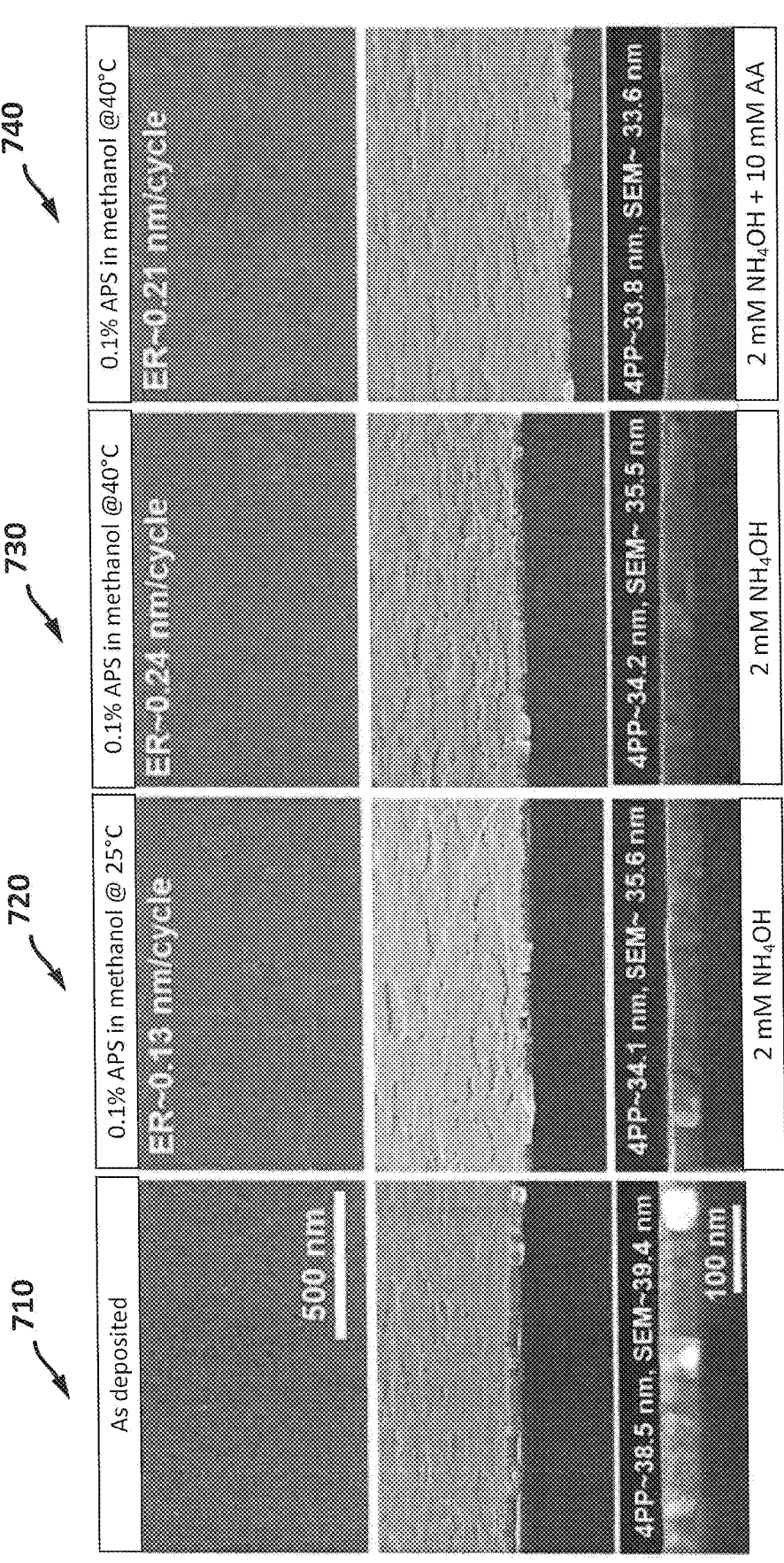
FIG. 7B provides SEM images depicting as-deposited tungsten and post-etch tungsten for the various etch conditions shown in FIG. 7A, illustrating the effect of adding 10 mM of ascorbic acid has on the post-etch surface roughness when using a 2 mM $NH_4OH$ solution.

Additional SEM images of as-deposited tungsten (710) and post-etch tungsten (720, 730 and 740) were obtained for the various etch conditions shown in FIG. 7A to illustrate the effect of adding 10 mM of ascorbic acid has on the post-etch surface roughness when using a 2 mM $NH_4OH$ solution. The SEM images 710-740 are shown in FIG. 7B. In the post-etch SEM images (720, 730 and 740), the etch amount was calculated from 4-point probe (4pp) resistivity measurements of the tungsten film and the etch amount measured by SEM cross section are in good agreement. The SEM images depicted in FIG. 7B shown that, for the same dissolution chemistry (2 mM $NH_4OH$) the post-etch surface morphology is nearly the same irrespective of the oxidizing temperature under study. The SEM images further show that removal of the tungsten oxide passivation in the ascorbic acid containing $NH_4OH$ solution greatly improves the post-etch morphology. The improved post-etch surface morphology can be attributed to ascorbic acid preventing metal attack in the $NH_4OH$ solution.

Figure 8A:
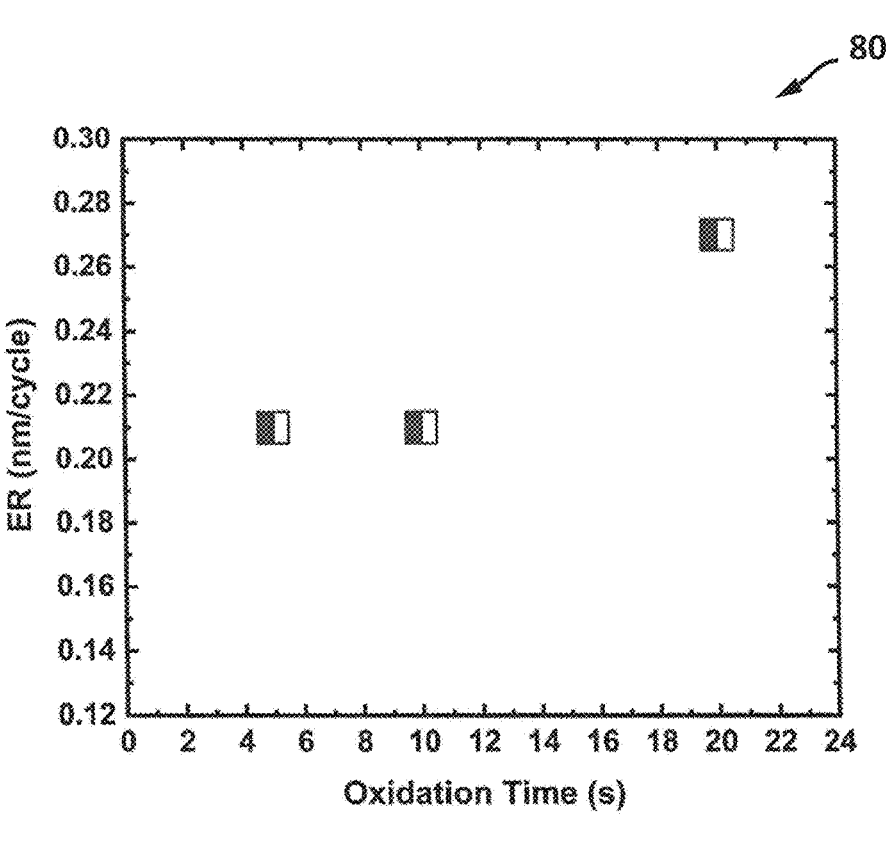
FIG. 8A is a graph depicting exemplary etch rates (expressed in nm/cycle) achieved as a function of oxidation time (expressed in seconds, s) when etching a tungsten surface using 0.1% APS dissolved in methanol at 40° C. in the surface modification solution and 10 mM of ascorbic acid dissolved in 2 mM of $NH_4OH$ and water in the dissolution solution.
Figure 8B:
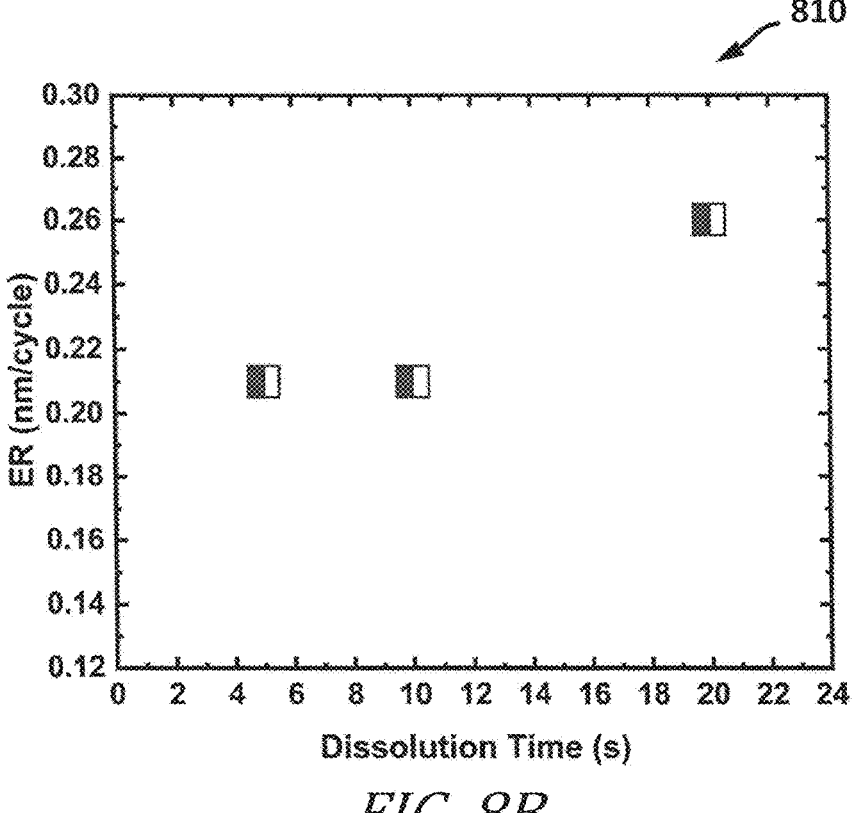
FIG. 8B is a graph depicting exemplary etch rates (expressed in nm/cycle) achieved as a function of dissolution time (expressed in seconds, s) when etching a tungsten surface using 0.1% APS dissolved in methanol at 40° C. in the surface modification solution and 10 mM of ascorbic acid dissolved in 2 mM of $NH_4OH$ and water in the dissolution solution.

Additional etch experiments were performed to investigate the effect of oxidation time and dissolution time on the tungsten etch rate. The graph 800 shown in FIG. 8A depicts exemplary etch rates (expressed in nm/cycle) achieved as a function of oxidation time (expressed in seconds, s) when the tungsten surface is etched by dipping the tungsten coupon in 0.1% APS dissolved in methanol at 40° C. for various oxidation times, followed by dissolution of the oxidized surface by dipping the tungsten coupon in 2 mM $NH_4OH$+10 mM AA solution for 10 seconds. As shown in the graph 800, a constant etch rate (~0.21 nm/cycle) is achieved between approximately 5-10 seconds of oxidation time, indicating the existence of small ALE window (~5 seconds). The graph 810 shown in FIG. 8B depicts exemplary etch rates (expressed in nm/cycle) achieved as a function of dissolution time (expressed in seconds, s) in 2 mM $NH_4OH$+10 mM AA solution after oxidizing the tungsten coupon in 0.1% APS-methanol solution at 40° C. for 10 s. As shown in the graph 810, a constant etch rate (~0.21 nm/cycle) is also achieved between approximately 5-10 seconds of dissolution time, which indicates that the dissolution of the tungsten oxide passivation layer is also self-limiting in nature. An increase in the tungsten etch rate after 10 seconds indicates a continuous etch in both the oxidizing and dissolution solutions.

Figure 9A:
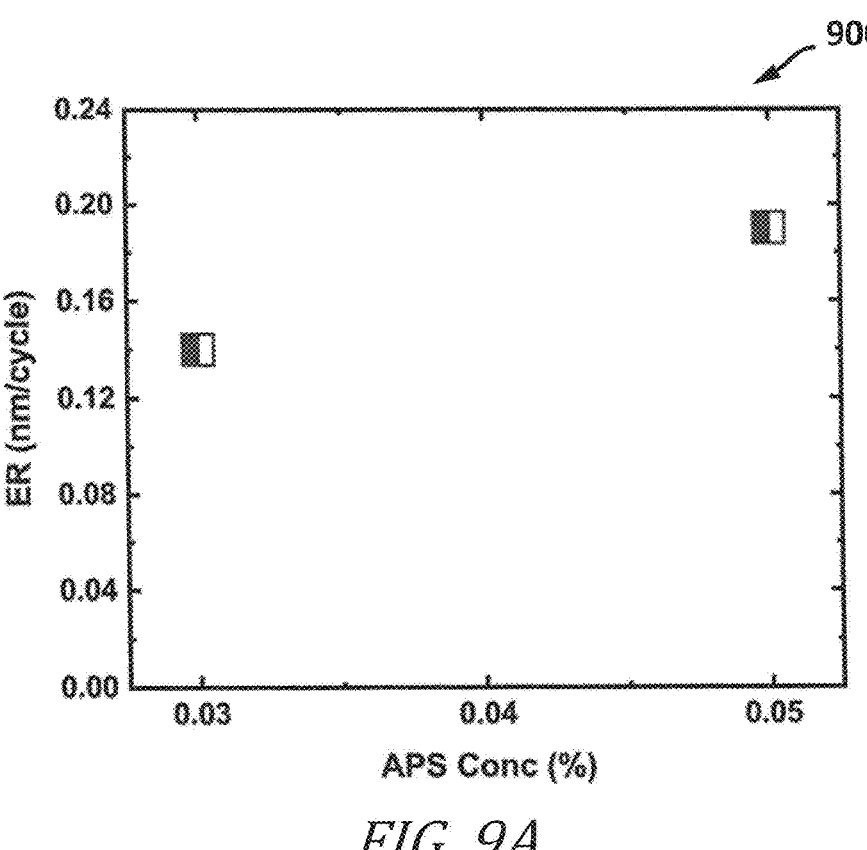
FIG. 9A is a graph depicting exemplary etch rates (expressed in nm/cycle) that may be achieved when etching a tungsten surface using different concentrations of APS in the surface modification solution.

Additional etch experiments were performed to investigate the effect of oxidation concentration and dissolution concentration on the tungsten etch rate. The graph 900 shown in FIG. 9A depicts exemplary etch rates (expressed in nm/cycle) achieved when the tungsten surface is etched by dipping the tungsten coupon in various APS-methanol solutions (e.g., a 0.03% APS-methanol solution and 0.05% APS-methanol solution) at 40° C. for 10 seconds, followed by dissolution of the oxidized surface by dipping the tungsten coupon in 0.5 mM $NH_4OH$ solution for 10 seconds. As shown in the graph 900, the tungsten surface can be oxidized using as low as 0.03% APS in the surface modification solution and the tungsten etch rate increases with APS concentration. The lower tungsten etch rate using 0.03% APS in methanol may be due to an unsaturated surface oxidation.

Figure 9B:
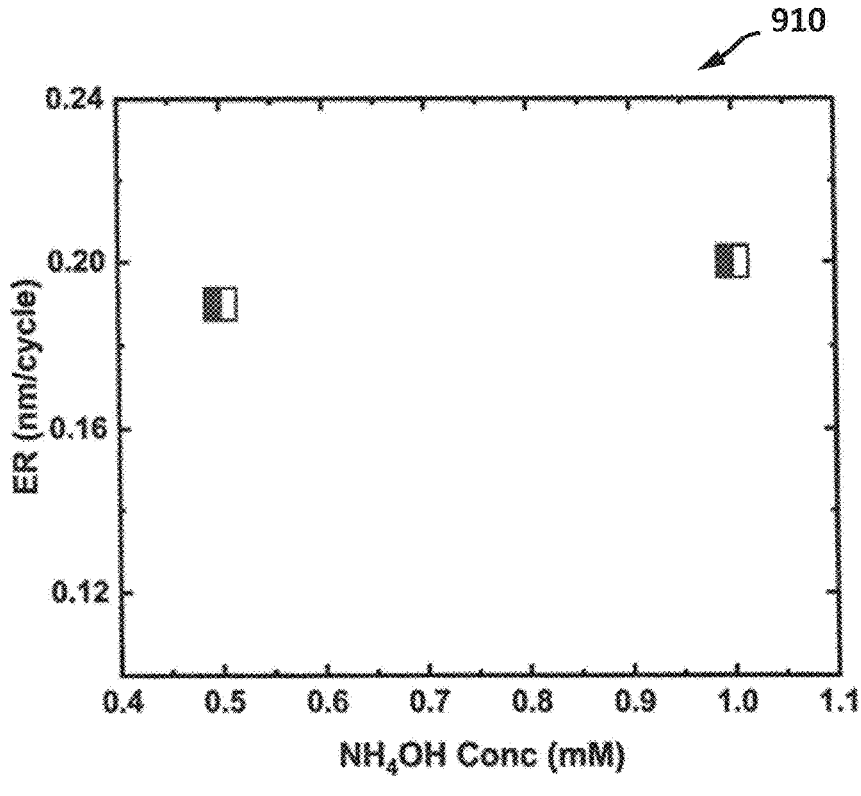
FIG. 9B is a graph depicting exemplary etch rates (expressed in nm/cycle) that may be achieved when etching a tungsten surface using different concentrations of $NH_4OH$ in the dissolution solution.

The graph 910 shown in FIG. 9B depicts exemplary etch rates (expressed in nm/cycle) achieved when the tungsten surface is etching by dipping the tungsten coupon in a 0.05% APS-methanol solution at 40° C. for 10 seconds, followed by dissolution of the oxidized surface by dipping the tungsten coupon in various $NH_4OH$-IPA solutions (e.g., a 0.5 mM $NH_4OH$-IPA solution and a 1.0 mM $NH_4OH$-IPA solution) for 10 seconds. As shown in the graph 900, the tungsten oxide passivation layer can be removed in as low as 0.5 mM $NH_4OH$-IPA solution, and the tungsten etch rate is nearly the same in the two dissolution solutions, regardless of $NH_4OH$ concentration in the dissolution solution.

Figure 10:
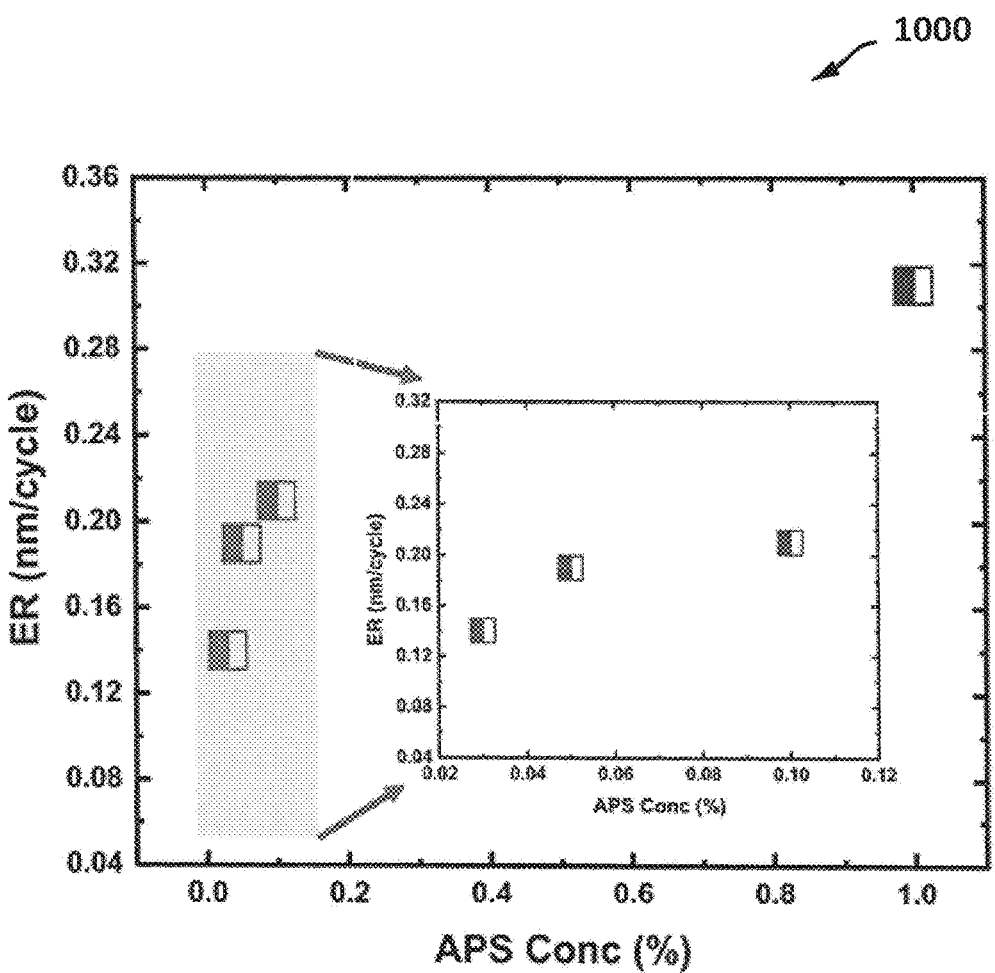
FIG. 10 is a graph depicting exemplary etch rates (expressed in nm/cycle) that may be achieved when etching a tungsten surface using relatively low concentrations (e.g., less than 0.2%) of APS in the surface modification solution.

The graph 1000 shown in FIG. 10 depicts exemplary etch rates (expressed in nm/cycle) achieved when etching the tungsten surface using a wide range of APS concentration (e.g., 0.03% to 1% APS) in the surface modification solution. To obtain the etch results shown in FIG. 10, tungsten coupons were dipped in APS-methanol solutions containing various concentrations of APS (e.g., 0.01% APS, 0.03% APS, 0.05% APS and 1% APS) to oxidize the tungsten surface, followed by dissolution of the oxidized surface by dipping the tungsten coupon in 0.5 mM $NH_4OH$ solution for 10 seconds. As shown in the graph 1000, the APS concentration varies significantly from 0.03% to 1% (nearly 33 times), whereas the tungsten etch rate varies from about 0.14 nm/cycle at 0.03% APS to 0.31 nm/cycle at 1% APS. The increase in etch rate with APS concentration indicates that the tungsten surface oxidation is not self-limiting with APS concentration, and may lead to a continuous etch at higher APS concentrations. At low APS concentration (e.g., 0.03%

APS to 0.2% APS), however, the oxidation behavior of the oxidation reaction is self-limiting.

Figure 11:
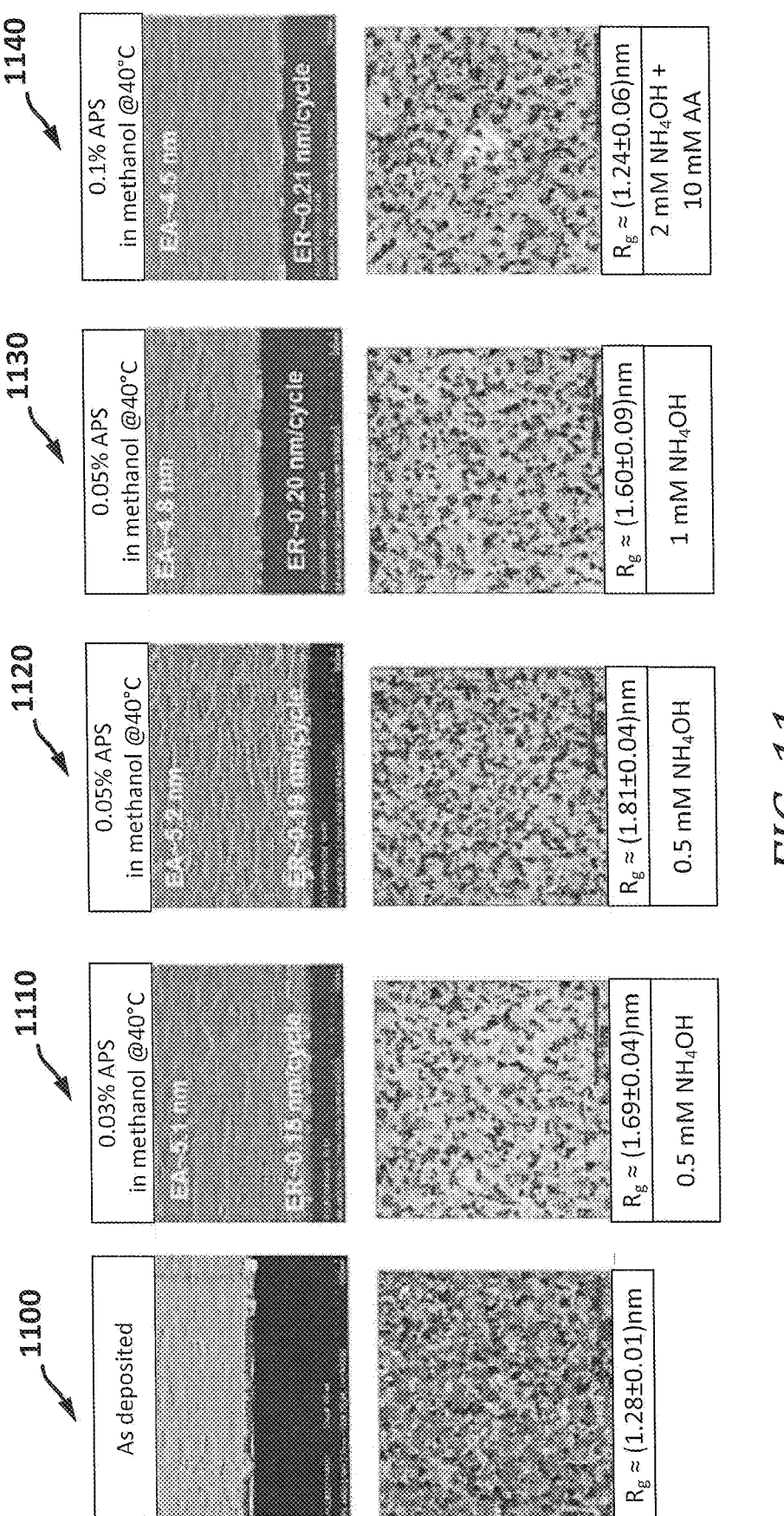
FIG. 11 provides SEM and atomic force microscopy (AFM) images of as-deposited tungsten and post-etch tungsten illustrating the post etch surface morphology of a tungsten surface etched using different oxidizer concentrations in the surface modification solution and different base concentrations in the dissolution solution.

SEM and atomic force microscopy (AFM) images of as-deposited tungsten (1100) and post-etch tungsten (1110, 1120, 1130 and 1140) are provided in FIG. 11 to illustrate the post etch surface morphology of a tungsten surface etched using different oxidizer concentrations (e.g., 0.03% APS, 0.05% APS and 0.1% APS) in the surface modification solution and different base concentrations (e.g., 0.5 mM $NH_4OH$, 1.0 mM $NH_4OH$ and 2 mM $NH_4OH$+10 mM AA) in the dissolution solution. The SEM and AFM images show that, for the same dissolution chemistry (0.5 mM $NH_4OH$), higher oxidizer concentrations lead to rougher post etch surface (RMS roughness of 1.69 nm for 0.03% APS vs 1.81 nm for 0.05% APS). For the same oxidizer concentration (0.05% APS in methanol), dissolution of the tungsten oxide passivation layer in 1 mM $NH_4OH$ slightly improves the post-etch roughness (RMS roughness of 1.81 nm for 0.05% APS/0.5 mM $NH_4OH$ vs 1.60 nm for 0.03% APS/1 mM $NH_4OH$). The post-etch surface roughness is preserved (RMS roughness of 1.24 nm) when the tungsten oxide passivation layer is dissolved in 2 mM $NH_4OH$ solution with 10 mM ascorbic acid even for higher 0.1% APS concentration. The SEM and AFM images further show that, for nearly the same tungsten etch amount, the surface smoothness is preserved when the tungsten surface is oxidized using 0.1% APS in methanol at 40° C. followed by dissolution of the tungsten oxide in ligand-assisted $NH_4OH$ solution.

As shown in the etching experiments above, the post-etch surface roughness of the tungsten layer increases with APS concentration, $NH_4OH$ concentration and etch amount. In the embodiments disclosed herein, the post-etch surface roughness of the tungsten layer is preserved by: (a) limiting the concentration of the oxidizer used in the surface solution, and (b) limiting the concentration of the base (or acid) used in the dissolution solution. In one example embodiment, approximately 0.005-0.1% APS may be used in the surface modification to oxidize the tungsten surface and form a self-limiting tungsten oxidation passivation layer, and approximately 0.05-1% $H_2O_2$ may be used in the dissolution solution to selectively dissolve the tungsten oxidation passivation layer without significantly increasing the post-etch surface roughness. In some embodiments, the oxidation temperature may be elevated to increase an etch rate of the tungsten layer when low oxidizer concentrations (e.g., 0.005-0.1% APS) are used. Adding a ligand (e.g., a reducing agent) to the dissolution solution prevents continuous parasitic etch of the unmodified tungsten surface and preserves the post-etch surface roughness of the tungsten layer.

FIG. 12 illustrates another embodiment of a method 1200 that can be used for etching a substrate using a wet ALE process. More specifically, FIG. 12 illustrates a method 1200 that can be used to etch a substrate having a tungsten (W) layer formed thereon using a wet ALE process, which utilizes ligand-assisted dissolution to prevent continuous etching of the tungsten layer and preserve post-etch surface roughness of the tungsten layer. It will be recognized that the embodiment of FIG. 12 is merely exemplary and additional methods may utilize the wet ALE techniques described herein. Further, additional processing steps may be added to the method shown in the FIG. 12 as the steps described are not intended to be exclusive. Moreover, the order of the steps is not limited to the order shown in the figures as different orders may occur and/or various steps may be performed in combination or at the same time.

The method 1200 shown in FIG. 12 begins by receiving the substrate, the substrate having a tungsten (W) layer formed thereon, wherein a tungsten surface is exposed on a surface of the substrate (in step 1210). Then, in step 1220, the method 1200 includes selectively etching the tungsten layer by performing multiple cycles of the wet ALE process, wherein each cycle comprises: (a) exposing the tungsten surface to a first etch solution comprising an oxidizer in a non-aqueous solvent to form a chemically modified W surface layer that is self-limiting and insoluble in the non-aqueous solvent; (b) rinsing the substrate with a first purge solution to remove the first etch solution from the surface of the substrate; (c) exposing the chemically modified W surface layer to a second etch solution to selectively dissolve the chemically modified W surface layer and expose an unmodified tungsten surface underlying the chemically modified W surface layer, wherein the second etch solution comprises a ligand that inhibits oxidation of the unmodified tungsten surface and prevents continuous etching of the tungsten layer; and (d) rinsing the substrate with a second purge solution to remove the second etch solution from the surface of the substrate and etch the tungsten layer.

In the method 1200, the oxidizer included within the first etch solution reacts with the tungsten surface to oxidize the tungsten surface and form the chemically modified W surface layer. In some embodiments, the oxidizer may react with the tungsten surface to oxidize the tungsten surface and form a tungsten trioxide ($WO_3$) passivation layer, which is self-limiting and insoluble in the non-aqueous solvent.

A wide variety of oxidizers and non-aqueous solvents may be utilized in the first etch solution, as described above. In some embodiments, the oxidizer may be a peroxide oxidizer and the non-aqueous solvent may be an organic solvent. For example, the oxidizer may be hydrogen peroxide ($H_2O_2$), a symmetric organic peroxide, an asymmetric organic peroxide, a monoperoxide, or a peroxy acid, and the non-aqueous solvent may be methanol ($CH_3OH$), diethyl ether ($(C_2H_5)_2O$), acetonitrile ($C_2H_3N$), dimethyl sulfoxide ($C_2H_6OS$), isopropyl alcohol (IPA), another alcohol, a ketone or an acetate. As noted above, $H_2O_2$ dissolved in IPA may be used in some embodiments to provide self-limiting oxidation behavior.

In some embodiments, the method 1200 may expose the tungsten surface to ultra-violet (UV) radiation to photolyze the oxidizer and create oxidizing radicals, which react with the tungsten surface to oxidize the tungsten surface and form the tungsten oxide passivation layer. In such embodiments, a lifetime of the oxidizing radicals may limit oxidation of the tungsten oxide passivation layer to provide quasi-self-limiting oxidation behavior.

In some embodiments, the oxidizer may be a non-peroxide oxidizer having a large reactant molecule (e.g., a reactant molecule having a molecular size substantially greater than 2 angstroms), and the non-aqueous solvent may be an organic solvent. For example, the non-peroxide oxidizer may be ammonium persulfate (APS), ferric chloride ($FeCl_3$), pyridine N-oxide ($C_5H_5NO$), 4-methyl morpholine ($C_5H_{11}NO$), trichloroisocyanuric acid ($C_3Cl_3N_3O_3$), an osmium tetroxide, a ruthenium tetroxide, a ruthenate, a manganate, a permanganate, a periodate, or a metal nitrate, and the non-aqueous solvent may be methanol ($CH_3OH$), diethyl ether ($(C_2H_5)_2O$), acetonitrile ($C_2H_3N$), dimethyl sulfoxide ($C_2H_6OS$), isopropyl alcohol (IPA), another alcohol, a ketone or an acetate. As noted above, APS dissolved in methanol may be used in some embodiments to provide self-limiting oxidation behavior.

In some embodiments, a concentration of the oxidizer in the first etch solution may be selected to avoid increasing the post-etch surface roughness of the tungsten layer compared to the initial surface roughness of the tungsten layer before etching. For example, when the first etch solution includes APS dissolved in methanol, the concentration of the APS in the first etch solution may range between 0.005% and 0.1%. When the first etch solution includes $H_2O_2$ dissolved in IPA, the concentration of the $H_2O_2$ in the first etch solution may range between 0.05% and 1%. Other concentrations of oxidizers may be appropriate when using other peroxide and non-peroxide oxidizers in the first etch solution. In some embodiments, the oxidation temperature may be increased to increase an etch rate of the tungsten layer when relatively low oxidizer concentrations are used in the first etch solution. For example, the tungsten surface may be exposed to the first etch solution at a temperature ranging between 25° C. and 65° C. to increase the etch rate of the tungsten layer when the first etch solution includes APS in methanol.

In some embodiments, the second etch solution may be an aqueous basic solution comprising a ligand and a base. In such embodiments, the base may remove the chemically modified W surface layer to expose the unmodified tungsten surface underlying the chemically modified W surface layer, while the ligand prevents the base from removing the unmodified tungsten surface and increasing a post-etch surface roughness of the tungsten layer compared to an initial surface roughness of the tungsten layer before etching.

A wide variety of bases and ligands may be utilized in the second etch solution, as described above. For example, the base may be ammonium hydroxide ($NH_4OH$), tetramethyl-ammonium hydroxide (TMAH), potassium hydroxide (KOH) or calcium hydroxide ($Ca(OH)_2$), and the ligand may be ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid. In one example embodiment, the second etch solution may include 0 mM to 10 mM ascorbic acid dissolved in 0.05 mM to 1M of ammonium hydroxide ($NH_4OH$) and water.

The methods and wet ALE processes described above and shown in FIGS. 1, 2 and 12 for etching tungsten can be accomplished using a variety of techniques. For example, the tungsten wet ALE processes disclosed above may be performed by dipping the tungsten sample in beakers of each etch solution. In this case, purging can be accomplished by either rinsing or dipping the sample in an appropriate solvent bath. The tungsten wet ALE processes can also be accomplished on a spinner. For example, the tungsten sample may be rotated while the etchant solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of metal. For high volume manufacturing, dispensing of etch solutions and rinses can be executed using conventional tools, such as wet etching tools and rinse tools.

Example process conditions (e.g., etch chemistry, temperature, processing time, etc.) are provided herein for etching transition metals, and more specifically, for etching tungsten using the methods and wet ALE processes described above and shown in FIGS. 1, 2 and 12. It will be recognized by those skilled in the art, however, that the methods and wet ALE processes disclosed herein are not strictly limited to the example process conditions described herein and may be performed using a wide variety of process conditions depending on the material being etched.

Figure 13:
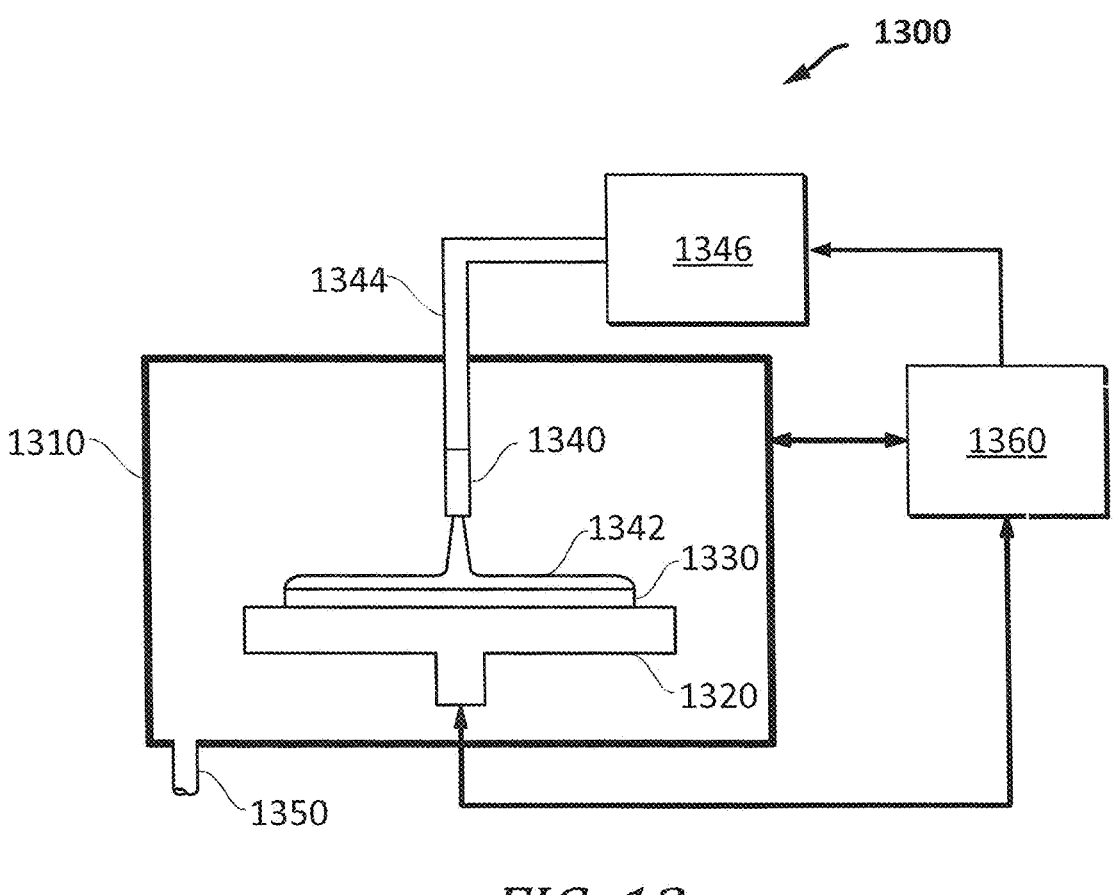
FIG. 13 is a block diagram illustrating one embodiment of a processing system that can be used to etch a transition metal surface, such as a tungsten surface, using the wet ALE processes disclosed herein.

FIG. 13 illustrates one embodiment of a processing system 1300 that can etch a transition metal surface, such as a tungsten surface, on a surface of a substrate 1330 using the wet ALE processes disclosed herein. As shown in FIG. 13, the processing system 1300 includes a process chamber 1310, which in some embodiments, may be a pressure controlled chamber. In the embodiment shown in FIG. 13, the process chamber 1310 is a spin chamber having a spinner 1320 (or spin chuck), which is configured to spin or rotate at a rotational speed. A substrate 1330 is held on the spinner 1320, for example, via electrostatic force or vacuum pressure. In one example, the substrate 1330 may be a semiconductor wafer having a transition metal, such as tungsten, formed on or within the substrate 1330.

The processing system 1300 shown in FIG. 13 further includes a liquid nozzle 1340, which is positioned over the substrate 1330 for dispensing various etch solutions 1342 onto a surface of the substrate 1330. The etch solutions 1342 dispensed onto the surface of the substrate 1330 may generally include a surface modification solution to chemically modify the tungsten surface and form a modified surface layer (e.g., a tungsten oxide, a molybdenum chloride or a tungsten oxychloride passivation layer), and a dissolution solution to selectively remove the modified surface layer from the tungsten surface. Purge solutions may also be dispensed onto the surface of the substrate 1330 between surface modification and dissolution steps to separate the surface modification and dissolution solutions. Examples of surface modification, dissolution and purge solutions are discussed above.

As shown in FIG. 13, the etch solutions 1342 may be stored within a chemical supply system 1346, which may include one or more reservoirs for holding the various etch solutions 1342 and a chemical injection manifold, which is fluidly coupled to the process chamber 1310 via a liquid supply line 1344. In operation, the chemical supply system 1346 may selectively apply desired chemicals to the process chamber 1310 via the liquid supply line 1344 and the liquid nozzle 1340 positioned within the process chamber 1310. Thus, the chemical supply system 1346 can be used to dispense the etch solutions 1342 onto the surface of the substrate 1330. The process chamber 1310 may further include a drain 1350 for removing the etch solutions 1342 from the process chamber 1310.

Components of the processing system 1300 can be coupled to, and controlled by, a controller 1360, which in turn, can be coupled to a corresponding memory storage unit and user interface (not shown). Various processing operations can be executed via the user interface, and various processing recipes and operations can be stored in the memory storage unit. Accordingly, a given substrate 1330 can be processed within the process chamber 1310 in accordance with a particular recipe. In some embodiments, a given substrate 1330 can be processed within the process chamber 1310 in accordance with an etch recipe that utilizes the wet ALE techniques described herein for etching tungsten.

The controller 1360 shown in block diagram form in FIG. 13 can be implemented in a wide variety of manners. In one example, the controller 1360 may be a computer. In another example, the controller 1360 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 13, the controller 1360 may be coupled to various components of the processing system 1300 to receive inputs from, and provide outputs to, the components. For example, the controller 1360 may be coupled to: the process chamber 1310 for controlling the temperature and/or pressure within the process chamber 1310; the spinner 1320 for controlling the rotational speed of the spinner 1320; and the chemical supply system 1346 for controlling the various etch solutions 1342 dispensed onto the substrate 1330. The controller 1360 may control other processing system components not shown in FIG. 13, as is known in the art.

In some embodiments, the controller 1360 may control the various components of the processing system 1300 in accordance with an etch recipe that utilizes the wet ALE techniques described herein for etching tungsten (W). For example, the controller 1360 may supply various control signals to the chemical supply system 1346, which cause the chemical supply system 1346 to: a) dispense a surface modification solution onto the surface of the substrate 1330 to chemically modify exposed surfaces of the tungsten and create a chemically modified W surface layer (e.g., a tungsten oxide, a tungsten chloride or a tungsten oxychloride passivation layer) on the substrate 1330; b) rinse the substrate 1330 with a first purge solution to remove the surface modification solution and excess reactants from the surface; c) dispense a dissolution solution onto the surface of the substrate 1330 to selectively remove or dissolve the chemically modified W surface layer; and d) rinse the substrate with a second purge solution to remove the dissolution solution from the surface of the substrate 1330. In some embodiments, the controller 1360 may supply the control signals to the chemical supply system 1346 in a cyclic manner, such that the steps a)-d) are repeated for one or more ALE cycles, until a desired amount of the tungsten has been removed.

The controller 1360 may also supply control signals to other processing system components. In some embodiments, for example, the controller 1360 may supply control signals to the spinner 1320 and/or the chemical supply system 1346 to dry the substrate 1330 after the second purge step is performed. In one example, the controller 1360 may control the rotational speed of the spinner 1320, so as to dry the substrate 1330 in a spin dry step. In another example, control signals supplied from the controller 1360 to the chemical supply system 1346 may cause a drying agent (such as, e.g., isopropyl alcohol) to be dispensed onto the surface of the substrate 1330 to further assist in drying the substrate before performing the spin dry step.

In some embodiments, the controller 1360 may control the temperature and/or the pressure within the process chamber 1310. In some embodiments, the surface modification, dissolution and purge steps of the tungsten wet ALE processes described herein may be performed at roughly the same temperature and pressure. In one example implementation, the surface modification, dissolution and purge steps may each be performed at (or near) atmospheric pressure and room temperature. Performing the processing steps within the same process chamber at roughly the same temperature and pressure decreases the cycle time and improves the throughput of the wet ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more of the surface modification, dissolution and purge steps can be run at above atmospheric pressure in a pressure vessel, or at reduced pressure in a vacuum chamber. Etch solutions can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. In one example implementation, the surface modification step may be performed at an elevated temperature (for example, at about 40° C.) to increase the kinetics of oxidation and increase the tungsten etch rate.

The present disclosure provides systems and methods that utilize new etch chemistries for etching tungsten (W) in a wet ALE process. As described above, the wet ALE processes and methods disclosed herein use a wide variety of techniques and etch chemistries to oxidize a tungsten layer exposed on a surface of a substrate and form a self-limiting, tungsten oxide passivation layer in a surface modification step of the wet ALE process. After forming the tungsten oxide passivation layer, ligand-assisted dissolution is used in the dissolution step of the wet ALE process to provide self-limited, selective dissolution of the tungsten oxide passivation layer without significantly increasing the post-etch surface roughness. Low concentrations of oxidizers and bases are respectively used in the surface modification and dissolution solutions to preserve surface roughness, while maintaining an acceptable tungsten etch rate.

Unlike conventional methods and chemistries used for etching tungsten, the new wet etch chemistries and methods described herein may be used, alone or in combination, to improve the oxidation behavior of the tungsten surface in the surface modification step and improve the dissolution behavior of the modified tungsten surface in the dissolution step. Although described herein for etching tungsten, the techniques described herein may also be used for etching other transition metals such as, but not limited to, molybdenum (Mo), cobalt (Co), copper (Cu), vanadium (V), niobium (Nb), tantalum (Ta), titanium (Ti), chromium (Cr) and nickel (Ni).

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:

receiving a substrate having a tungsten (W) layer formed thereon, wherein a tungsten surface is exposed on a surface of the substrate;

exposing the surface of the substrate to a surface modification solution comprising an oxidizer dissolved in a non-aqueous solvent, wherein the oxidizer reacts with the tungsten surface to oxidize the tungsten surface and form a tungsten oxide passivation layer, which is self-limiting and insoluble in the non-aqueous solvent;

removing the surface modification solution from the surface of the substrate subsequent to forming the tungsten oxide passivation layer;

exposing the surface of the substrate to a dissolution solution comprising a ligand to selectively remove the tungsten oxide passivation layer, wherein the dissolution solution reacts with the tungsten oxide passivation layer to form soluble species, which are dissolved by the dissolution solution to expose an unmodified tungsten surface underlying the tungsten oxide passivation layer, wherein the ligand prevents the dissolution solution from attacking and removing the unmodified tungsten surface; and removing the dissolution solution and the soluble species from the surface of the substrate to etch the tungsten layer.

2. The method of claim 1, further comprising repeating said exposing the surface of the substrate to the surface modification solution, removing the surface modification solution, exposing the surface of the substrate to the dissolution solution, and removing the dissolution solution and the soluble species a number of times until a predetermined amount of the tungsten layer is removed from the substrate.

3. The method of claim 1, wherein the ligand is a reducing agent that inhibits oxidation of the unmodified tungsten surface and prevents continuous etching of the tungsten layer to provide a post-etch surface roughness of the tungsten layer that is substantially equal to an initial surface roughness of the tungsten layer before etching.

4. The method of claim 3, wherein the ligand contains an ascorbate anion.

5. The method of claim 4, wherein the ligand is ascorbic acid, sodium ascorbate, calcium ascorbate or potassium ascorbate.

6. The method of claim 3, wherein the ligand is ascorbic acid.

7. The method of claim 3, wherein the ligand is oxalic acid, formic acid, acetic acid, ethylenediamine, ethylenediaminetetraacetic acid (EDTA) or iminodiacetic acid.

8. The method of claim 1, wherein the dissolution solution is an aqueous basic solution comprising: (i) the ligand, and (ii) ammonium hydroxide ($NH_4OH$), tetramethylammonium hydroxide (TMAH), potassium hydroxide (KOH) or calcium hydroxide ($Ca(OH)_2$).

9. The method of claim 1, wherein the dissolution solution is an aqueous acidic solution comprising: (i) the ligand, and (ii) hydrochloric acid (HCl), nitric acid or sulfuric acid.

10. The method of claim 1, wherein the oxidizer reacts with the tungsten surface to oxidize the tungsten surface and form a tungsten trioxide ($WO_3$) passivation layer, which is self-limiting and insoluble in the non-aqueous solvent, and wherein a concentration of the oxidizer in the surface modification solution is selected to avoid substantially increasing a post-etch surface roughness of the tungsten layer compared to an initial surface roughness of the tungsten layer before etching.

11. The method of claim 10, wherein the oxidizer comprises ammonium persulfate (APS), wherein the non-aqueous solvent comprises methanol ($CH_3OH$), and wherein a concentration of the ammonium persulfate in the surface modification solution ranges between 0.005% and 0.1%.

12. The method of claim 10, wherein the oxidizer comprises hydrogen peroxide ($H_2O_2$), wherein the non-aqueous solvent comprises isopropyl alcohol (IPA), and wherein a concentration of the hydrogen peroxide in the surface modification solution ranges between 0.05% and 1%.

13. The method of claim 10, wherein said exposing the surface of the substrate to the surface modification solution comprises:

exposing the surface of the substrate to the surface modification solution at a temperature ranging between 25° C. and 65° C. to increase an etch rate of the tungsten layer.

14. The method of claim 10, wherein the dissolution solution is an aqueous basic solution comprising the ligand and a base, wherein the base removes the tungsten trioxide ($WO_3$) passivation layer to expose the unmodified tungsten surface underlying the tungsten trioxide ($WO_3$) passivation layer, and wherein the ligand prevents the base from removing the unmodified tungsten surface and increasing the post-etch surface roughness of the tungsten layer compared to the initial surface roughness of the tungsten layer before etching.

15. The method of claim 14, wherein the dissolution solution is an aqueous basic solution comprising 0 mM to 10 mM ascorbic acid dissolved in 0.05 mM to 1 M of ammonium hydroxide ($NH_4OH$) and water.

16. A method of etching a substrate using a wet atomic layer etching (ALE) process, the method comprising:

receiving the substrate, the substrate having a tungsten (W) layer formed thereon, wherein a tungsten surface is exposed on a surface of the substrate; and selectively etching the tungsten layer by performing multiple cycles of the wet ALE process, wherein each cycle comprises:

exposing the tungsten surface to a first etch solution comprising an oxidizer in a non-aqueous solvent to form a chemically modified W surface layer that is self-limiting and insoluble in the non-aqueous solvent;

rinsing the substrate with a first purge solution to remove the first etch solution from the surface of the substrate;

exposing the chemically modified W surface layer to a second etch solution to selectively dissolve the chemically modified W surface layer and expose an unmodified tungsten surface underlying the chemically modified W surface layer, wherein the second etch solution comprises a ligand that inhibits oxidation of the unmodified tungsten surface and prevents continuous etching of the tungsten layer; and rinsing the substrate with a second purge solution to remove the second etch solution from the surface of the substrate and etch the tungsten layer.

17. The method of claim 16, wherein the oxidizer reacts with the tungsten surface to oxidize the tungsten surface and form a tungsten trioxide ($WO_3$) passivation layer, which is self-limiting and insoluble in the non-aqueous solvent, and wherein a concentration of the oxidizer in the first etch solution is selected to avoid substantially increasing a post-etch surface roughness of the tungsten layer compared to an initial surface roughness of the tungsten layer before etching.

18. The method of claim 17, wherein the oxidizer comprises ammonium persulfate (APS), wherein the non-aqueous solvent comprises methanol (CH₃OH), and wherein a concentration of the ammonium persulfate in the first etch solution ranges between 0.005% and 0.1%.

19. The method of claim 17, wherein the oxidizer comprises hydrogen peroxide ($H_2O_2$), wherein the non-aqueous solvent comprises isopropyl alcohol (IPA), and wherein a concentration of the hydrogen peroxide in the first etch solution ranges between 0.05% and 1%.

20. The method of claim 17, wherein said exposing the tungsten surface to the first etch solution comprises:

exposing the tungsten surface to the first etch solution at a temperature ranging between 25° C. and 65° C. to increase an etch rate of the tungsten layer.

21. The method of claim 16, wherein the second etch solution is an aqueous basic solution comprising the ligand and a base, wherein the base removes the chemically modified W surface layer to expose the unmodified tungsten surface underlying the chemically modified W surface layer, and wherein the ligand prevents the base from removing the unmodified tungsten surface and increasing a post-etch surface roughness of the tungsten layer compared to an initial surface roughness of the tungsten layer before etching.

22. The method of claim 21, wherein the ligand is ascorbic acid, sodium ascorbate, calcium ascorbate, potassium ascorbate, oxalic acid, formic acid, acetic acid, ethylenediamine, ethylenediaminetetraacetic acid (EDTA) or iminodiacetic acid.

23. The method of claim 21, wherein the base is ammonium hydroxide (NH₄OH), tetramethylammonium hydroxide (TMAH), potassium hydroxide (KOH) or calcium hydroxide (Ca(OH)₂).

24. The method of claim 16, wherein the second etch solution comprises 0 mM to 10 mM ascorbic acid dissolved in 0.05 mM to 1 M of ammonium hydroxide (NH₄OH) and water.

* * * * *